US011482457B2

(12) United States Patent
Jambunathan et al.

(10) Patent No.: US 11,482,457 B2
(45) Date of Patent: Oct. 25, 2022

(54) SUBSTRATE DEFECT BLOCKING LAYERS FOR STRAINED CHANNEL SEMICONDUCTOR DEVICES

(71) Applicant: Intel Corporation, Santa Clara, CA (US)

(72) Inventors: Karthik Jambunathan, Hillsboro, OR (US); Cory C. Bomberger, Portland, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/640,470

(22) PCT Filed: Sep. 22, 2017

(86) PCT No.: PCT/US2017/052886
§ 371 (c)(1),
(2) Date: Feb. 20, 2020

(87) PCT Pub. No.: WO2019/059920
PCT Pub. Date: Mar. 28, 2019

(65) Prior Publication Data
US 2020/0219774 A1 Jul. 9, 2020

(51) Int. Cl.
*H01L 29/78* (2006.01)
*H01L 21/8238* (2006.01)
*H01L 27/092* (2006.01)
*H01L 29/06* (2006.01)
*H01L 29/10* (2006.01)
*H01L 29/66* (2006.01)

(52) U.S. Cl.
CPC .............. *H01L 21/823807* (2013.01); *H01L 21/823821* (2013.01); *H01L 27/0924* (2013.01);
(Continued)

(58) Field of Classification Search
CPC ..... H01L 21/823807; H01L 21/823821; H01L 27/0924; H01L 29/0669; H01L 29/1054;
(Continued)

(56) References Cited

U.S. PATENT DOCUMENTS 8,119,494 B1    2/2012 Vellianitis
2009/0242990 A1* 10/2009 Saitoh ................. H01L 29/7842
                                                            257/351
(Continued)

FOREIGN PATENT DOCUMENTS

WO    2019059920 A1    3/2019

OTHER PUBLICATIONS

International Search Report and Written Opinion received for PCT No. PCT/US2017/052886. dated Jun. 22, 2018. 14 pages.
(Continued)

*Primary Examiner* — Mohammed R Alam
(74) *Attorney, Agent, or Firm* — Schwabe, Williamson & Wyatt, P.C.

(57) ABSTRACT

Techniques are described for forming strained fins for co-integrated n-MOS and p-MOS devices that include one or more defect trapping layers that prevent defects from migrating into channel regions of the various co-integrated n-MOS and p-MOS devices. A defect trapping layer can include one or more patterned dielectric layers that define aspect ratio trapping trenches. An alternative defect trapping layer can include a superlattice structure of alternating, epitaxially mismatched materials that provides an energetic barrier to the migration of defect. Regardless, the defect trapping layer can prevent dislocations, stacking faults, and other crystallographic defects present in a relaxed silicon germanium layer from migrating into strained n-MOS and p-MOS channel regions grown thereon.

21 Claims, 10 Drawing Sheets

(52) U.S. Cl.
CPC ...... *H01L 29/0669* (2013.01); *H01L 29/1054* (2013.01); *H01L 29/1079* (2013.01); *H01L 29/66545* (2013.01); *H01L 29/7849* (2013.01)

(58) Field of Classification Search
CPC ........... H01L 29/1079; H01L 29/66545; H01L 29/7849; H01L 29/0673; H01L 29/66439; H01L 29/775; B82Y 10/00
See application file for complete search history.

(56) References Cited

U.S. PATENT DOCUMENTS

| | | | |
|---|---|---|---|
| 2011/0147711 A1* | 6/2011 | Pillarisetty | H01L 29/1054 257/24 |
| 2012/0196414 A1 | 8/2012 | Ngai | |
| 2013/0056827 A1* | 3/2013 | Tsai | H01L 29/66795 257/E21.409 |
| 2015/0061078 A1 | 3/2015 | Abel | |
| 2015/0200246 A1 | 7/2015 | Lochtefeld | |
| 2015/0255610 A1* | 9/2015 | Xiao | H01L 29/1054 257/190 |
| 2016/0181099 A1* | 6/2016 | Mukherjee | H01L 21/02636 257/190 |
| 2016/0329327 A1* | 11/2016 | Lee | H01L 21/823807 |
| 2017/0194506 A1 | 7/2017 | Pillarisetty | |

OTHER PUBLICATIONS

PCT International Preliminary Report on Patentability for Appl No. PCT/US2017/052886 dated Mar. 24, 2020, 9 pages.

\* cited by examiner

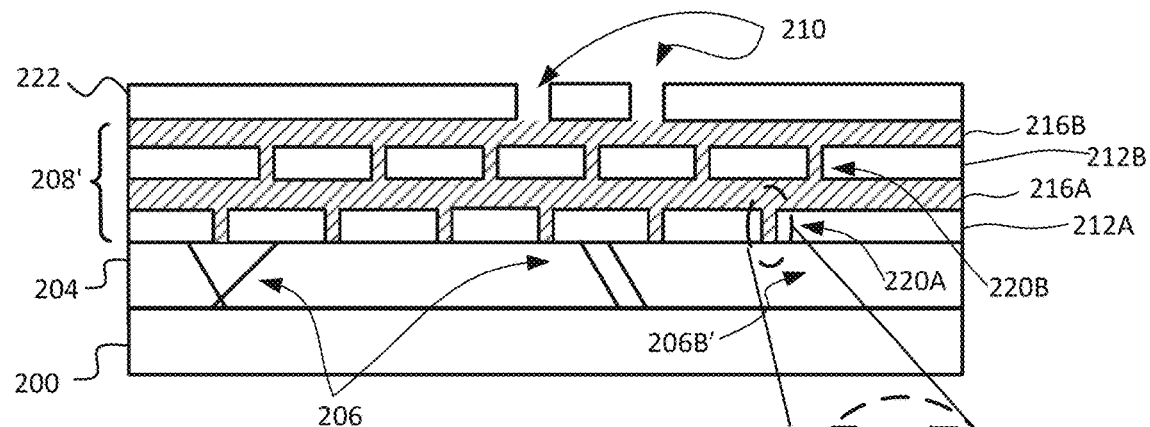
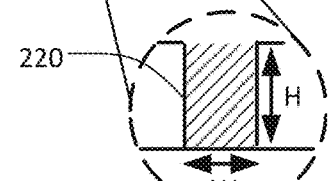
FIG. 2B'
FIG. 2B'''
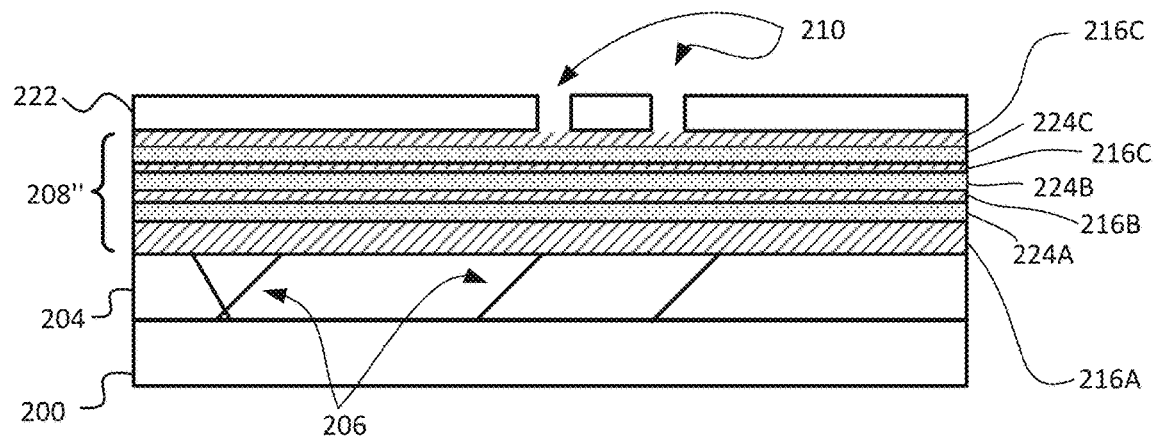
FIG. 2B''
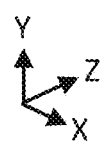

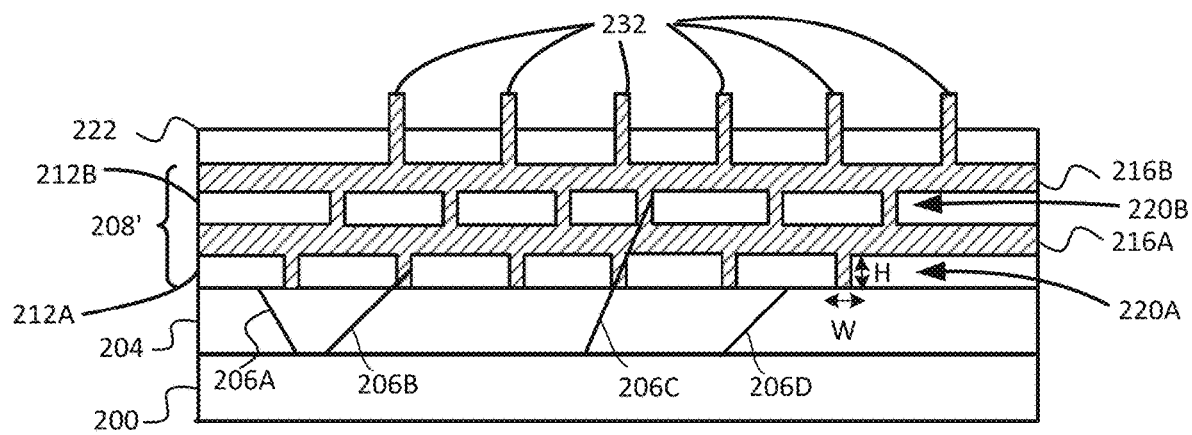
FIG. 2C'
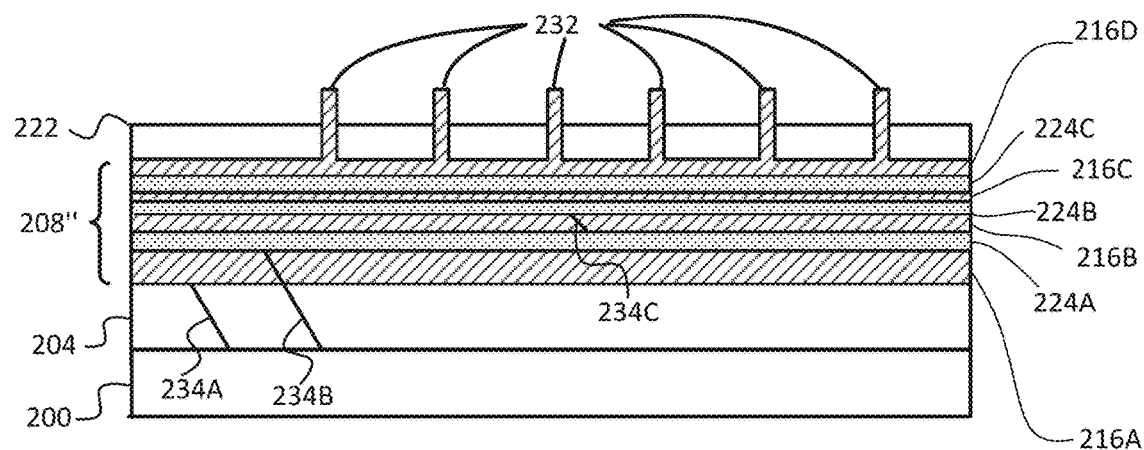
FIG. 2C''
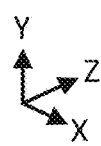

SUBSTRATE DEFECT BLOCKING LAYERS FOR STRAINED CHANNEL SEMICONDUCTOR DEVICES

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). Generally, such multiple-gate FETs may be referred to as MuGFETs. A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

Figure 1A:
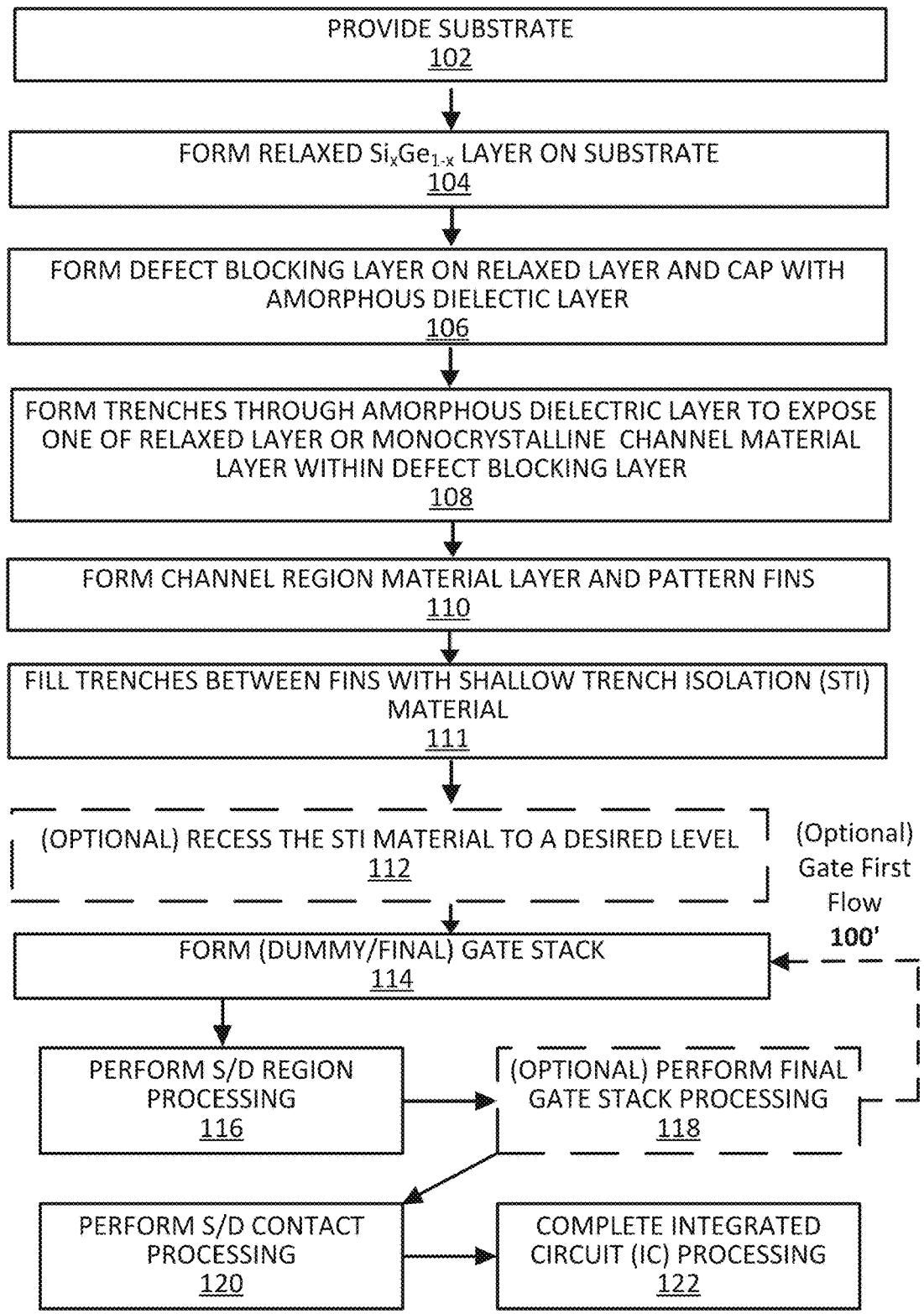
FIGS. 1A-1C illustrate a method of forming an integrated circuit (IC) including low defect density strained fins for co-integrated n-MOS and p-MOS devices, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are described for forming strained fins for co-integrated n-MOS and p-MOS devices that can include a defect trapping layer (or layers). The defect trapping layer(s) prevent defects from migrating into channel regions of the co-integrated n-MOS and p-MOS devices. In some embodiments, a defect trapping layer can include one or more patterned dielectric layers that define aspect ratio trapping trenches filled with semiconductor material used for device channel regions. In some embodiments, the defect trapping layer can include a superlattice structure of alternating, epitaxially mismatched materials. The superlattice structure may include, for instance, alternating layers of semiconductor material and dielectric material. Some other embodiments can include a combination of these types of defect trapping layers. In some embodiments, the defect trapping layer can prevent dislocations, stacking faults, and other crystallographic defects present in a relaxed silicon germanium layer from migrating into strained n-MOS and p-MOS channel regions grown thereon.

General Overview

Co-integration of both n-MOS and p-MOS devices within a same CMOS integrated circuit (or on a same substrate) can be advantageous because n-MOS and p-MOS devices have different capabilities and can be used for different applications. The co-integration of n-MOS and p-MOS devices can improve the performance and versatility of an integrated circuit. However, various issues arise in the co-integration of n-MOS and p-MOS devices. For instance, when monolithically integrating n-MOS and p-MOS devices on the same substrate, forming high performance versions of both devices can be difficult. One example difficulty is that n-MOS devices and p-MOS devices can perform better when fabricated from different materials. For example, silicon (Si) or low-content germanium (Ge) silicon germanium (SiGe) can be used to fabricate high performance n-MOS devices. In another example, high-content SiGe or Ge can be used to fabricate high performance p-MOS devices. Another example difficulty is that n-MOS devices can perform better with increased tensile stress in the channel region (which improves electron charge carrier mobility) and p-MOS devices can perform better with increased compressive strain in the channel region (which improves hole charge carrier mobility). One possible technique that can be used to facilitate co-integration of n-MOS and p-MOS devices with these different channel region strains and materials includes growing a buffer layer of SiGe on a substrate (in some examples, a Si substrate). This buffer layer can, in some examples, provide a seeding layer from which to grow the different transistor channel materials used for the different n-MOS and p-MOS devices while also facilitating the corresponding preferred strain. In some examples, these current techniques involve growth of SiGe layer that can be 300 nm thick, or more, on the substrate. Such a thick buffer layer is employed to allow the SiGe layer to relax any strain caused by an epitaxial mismatch with the underlying substrate. This, in turn, can produce a low dislocation density at an interface between the SiGe buffer layer and a channel region. A low dislocation density at the SiGe buffer layer/channel region interface is desirable because even low defect densities in channel regions can impair device performance, which would inhibit the strain-induced increase in charge carrier mobility. However, employing such a thick buffer layer can cause bowing (i.e., a physical curvature) of the entire substrate during the IC fabrication process. This bowing is highly undesirable because it can create and/or exacerbate defects and dislocations within the integrated circuit devices, among other problems. Employing a thinner buffer layer (e.g., having a thickness of less than 300 nm) could cause some defects formed within the thinner buffer layer to propagate to its top surface. If transistor channel material is grown from the top surface of the thinner buffer layer in an effort to impart strain on the channel material, then the defects in the thinner buffer layer can propagate into the channel material, relaxing the channel region strain which in turn reduces the charge carrier mobility.

Thus, and in accordance with one or more embodiments of the present disclosure, techniques are provided for forming low defect density semiconductor devices of strained fins for n-MOS and p-MOS devices co-integrated on a common substrate. In some embodiments, the techniques can be used to monolithically form tensile-strained channel regions to be used for n-MOS devices and compressive-strained channel regions to be used for p-MOS devices on the same substrate, such that a single integrated circuit (IC) can include both device types. In some embodiments, the oppositely stressed fins may be achieved by employing a relaxed SiGe (rSiGe) layer (e.g., whether as thick as 300 nm or as thin as 20 nm, according to some embodiments) from which the tensile and compressive-strained channel material can be formed. The atomic percentage of Ge content (the Ge concentration) included in the rSiGe layer determines the lattice constant of the material. As can be understood based on this disclosure, if Si and/or SiGe material with a Ge content less than the Ge content of the rSiGe layer is grown on the rSiGe layer, the Si/SiGe material will be tensile-strained relative to the rSiGe layer. This can enable the formation of tensile-stressed Si/SiGe channel regions that can be used to form one or more n-MOS devices. As can also be understood based on this disclosure, if SiGe with a Ge content greater than the rSiGe layer is grown on the rSiGe layer, the SiGe/Ge material will be compressive-strained relative to the rSiGe layer. This can enable the formation of compressive-stressed SiGe/Ge channel regions that can be used to form one or more p-MOS devices. Therefore, in some embodiments, the techniques described herein include the formation of tensile-stressed Si and/or SiGe fins and compressive-stressed SiGe and/or Ge fins using a single rSiGe layer to enable the co-integration of n-MOS and p-MOS devices on a same substrate, where each set of devices includes preferred materials and preferred stress/strain to enhance their respective performance.

Furthermore, in accordance with one or more embodiments of the present disclosure, techniques are described for trapping defects to prevent migration of the defects into the strained channel material grown thereon, including for devices having gate to gate or source/drain to source/drain pitches of 100 nm or less. Not only does this preserve the improvement in device performance from channel strain, but it enables the use of thin (e.g., less than 200 nm thick, less than 100 nm thick, or thinner) rSiGe layers that have relatively high defect densities (e.g., of threading dislocations, stacking faults, among others) at the interface with the strained channel regions. Using one or more of the techniques described herein, using thick rSiGe layers (~300 nm or thicker) that can cause substrate bowing can be avoided, while also avoiding the detriment to device performance from defects in thinner rSiGe layers migrating into channel regions.

Some of the embodiments of the present disclosure can include one or more of (1) a patterned dielectric defect blocking layer (or multiple patterned dielectric layers) defining defect trapping trenches in which semiconductor channel material is grown, and (2) an epitaxial SiGe superlattice defect blocking layer between an rSiGe layer and the channel regions. Each of these embodiments, individually or in one or more combinations with one another, can reduce defect density and/or defect mobility within the rSiGe layer, thus reducing defect density within the strained channel regions of both n-MOS and p-MOS devices. In some such examples, a defect density within the rSiGe layer can be as high as $10^8$ defects per square centimeter to $10^9$ per square centimeter. Upon application of one patterned dielectric defect blocking layer using ART trenches or a single set of superlattice layers (i.e., one layer of monocrystalline channel material and one layer of an epitaxially mismatched material), the defect density can be reduced to less than $10^7$ defects per square centimeter. The defect density can be further reduced by an order of magnitude upon the addition of each additional patterned dielectric defect blocking layer using ART trenches and/or set of superlattice layers down to $10^6$ defects per square centimeter, $10^5$ defects per square centimeter, or lower.

Architecture and Methodology

FIG. 1A illustrates method 100 of forming an integrated circuit (IC) including a modified silicon substrate that enables formation of a thin, relaxed, Ge-based layer (rSiGe layer) that includes one or more defect trapping features. Strained n-MOS and p-MOS channel regions can be co-integrated over the rSiGe layer, as described above. In accordance with some embodiments of the present disclosure, the defect trapping features can include any one or more of the following: one or more amorphous dielectric layers that define aspect ratio trapping (ART) trenches in which channel region material is grown; and a superlattice structure of alternating, thin (e.g., less than 5 nm) epitaxially mismatched layers. FIGS. 2A-2J illustrate example IC structures formed when carrying out the method 100 of FIG. 1A and optionally one or more of the sub-methods 106' and 106", in accordance with some embodiments of the present disclosure. The techniques and structures described herein are primarily depicted and described in the context of forming finned or FinFET transistor configurations (e.g., tri-gate transistor configurations), for ease of illustration. However, in some embodiments, the techniques may be used to form transistors of any suitable geometry or configuration, as will be apparent in light of this disclosure. Also note that the techniques for forming the finned structures used in the channel region of one or more transistors may include blanket deposition techniques (e.g., using processes 102-110 to form structures illustrated in FIGS. 2A-2B, 2B', 2B'', 2C), and/or any other suitable techniques as will be apparent in light of this disclosure. Further note that method 100 includes a primary path that illustrates a gate last transistor fabrication process flow (e.g., a replacement gate process flow), which is utilized in some embodiments. However, in other embodiments, a gate first process flow may be used, as will be described herein (and which is illustrated with the alternative gate first flow 100' indicator in FIG. 1A). Numerous variations and configurations will be apparent in light of this disclosure.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. For instance, FIG. 2I illustrates an example IC structure including transistors having finned and nanowire configurations, as will be described in more detail below. Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Method 100 of FIG. 1A begins by providing 102 a substrate 200 selected for growth of the rSiGe layer. Substrate 200, in some embodiments may include a bulk Si substrate (e.g., a bulk Si wafer), a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, substrate 200 may be doped with any suitable n-type and/or p-type dopant at a dopant concentration in the range of 1E16 to 1E22 atoms per cubic cm, for example. For instance, the Si of substrate 200 may be p-type doped using a suitable acceptor (e.g., boron) or n-type doped using a suitable donor (e.g., phosphorous, arsenic) with a doping concentration of at least 1E16 atoms per cubic cm. However, in some embodiments, substrate 200 may be undoped/intrinsic or relatively minimally doped (such as including a dopant concentration of less than 1E16 atoms per cubic cm), for example. In general, although substrate 200 is referred to herein as a Si substrate, in some embodiments, it may essentially consist of Si, while in other embodiments, the substrate may primarily include Si but may also include other material (e.g., dopant at a given concentration). Also note that the substrate 200 may include relatively high quality or device quality monocrystalline Si that provides a suitable template/seeding surface from which other monocrystalline semiconductor material features and layers can be formed. Therefore, unless otherwise explicitly stated, a Si substrate as described herein is not intended to be limited to a substrate that only includes Si.

In some embodiments, substrate 200 may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers in the figures for ease of illustration, in some instances, substrate 200 may be relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 200 may include a multilayer structure including two or more distinct layers (that may or may not be compositionally different). In some embodiments, substrate 200 may include grading (e.g., increasing and/or decreasing) of one or more material concentrations throughout at least a portion of the substrate 200. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Figure 2A:
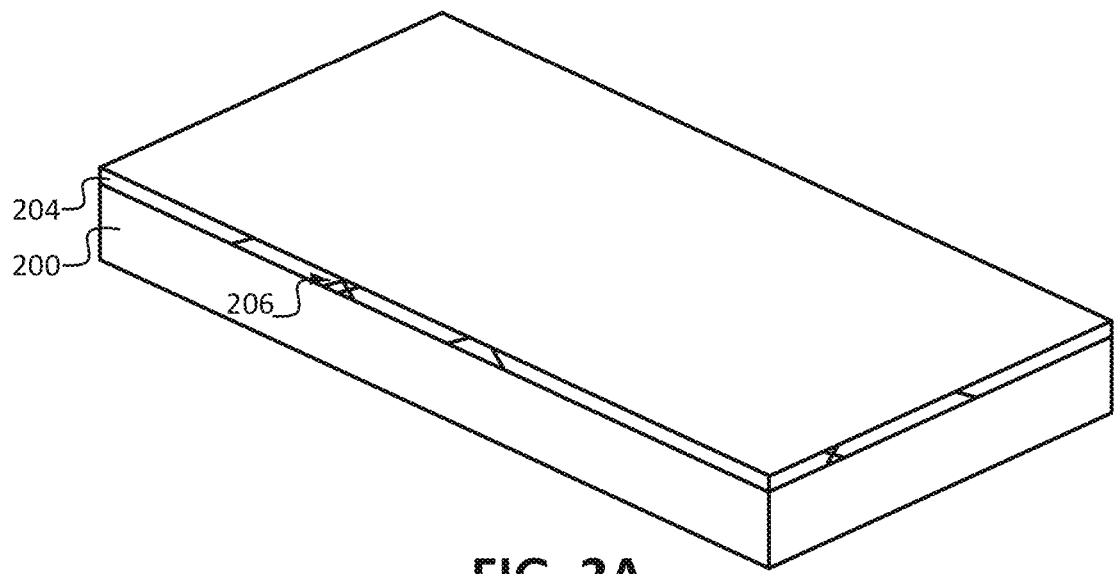
FIGS. 2A-2J illustrate example IC structures formed when carrying out the method of FIGS. 1A, 1B, and 1C specifically up to the point that strained fins have been formed, in accordance with some embodiments.

Method 100 of FIG. 1A continues with forming 104 a relaxed $Si_{1-x}Ge_x$ layer 204 (referred to simply rSiGe) on the substrate 200, as shown in FIG. 2A, in accordance with some embodiments of the present disclosure. In some embodiments, the rSiGe layer 204 may be formed using any suitable processing, such as one or more of the aforementioned deposition/epitaxial growth processes (e.g., CVD, PVD, ALD, VPE, MBE, LPE) and/or any other suitable processing, as can be understood based on this disclosure. The rSiGe layer 204, in some embodiments, may include alloying elements that include, but are not limited to, tin (Sn)

and/or carbon (C). In other words, in some embodiments, rSiGe layer 204 is a monocrystalline group IV semiconductor material that at least includes germanium. In some embodiments, the rSiGe layer 204 may or may not be doped with any suitable dopant (e.g., boron, phosphorous, and/or arsenic). In embodiments where the rSiGe layer 204 is doped, it may be n-type doped (e.g., with phosphorous or arsenic) or p-type doped (e.g., with boron) at a dopant concentration in the range of 1E16 to 1E22 atoms per cubic cm, for example. The doping and type of dopant can be selected so as to reduce current leakage from a source region to a drain region below the channel region. For example, n-type doping in a portion of the rSiGe layer 204 corresponding to a p-MOS channel region can reduce "sub-fin" leakage through the rSiGe layer 204 below the p-MOS channel region (not shown). Similarly, p-type doping in a portion of the rSiGe layer 204 corresponding to an n-MOS channel region can reduce sub-fin leakage through the rSiGe layer 204 below the n-MOS channel region (not shown). In some embodiments, rSiGe-layer 204 may include a multi-layer structure including two or more distinct layers (that may or may not be compositionally different). In some embodiments, rSiGe layer 204 may include grading (e.g., increasing and/or decreasing) of one or more material concentrations throughout at least a portion of the layer.

In some embodiments, the rSiGe layer 204 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. In other examples, the rSiGe layer 204 can be as thick as 3 μm. Other suitable materials and thickness values/ranges/thresholds will be apparent in light of this disclosure.

The rSiGe layer 204, in some embodiments is epitaxially mismatched with the underlying substrate 200. In some examples, this epitaxial mismatch includes a difference between lattice parameters of the rSiGe layer 204 and the material of the substrate 200 that is 1% or more. This difference of at least 1% can change as a function of germanium concentration in the rSiGe layer 204. Regardless of the difference, this epitaxial mismatch can give rise to a number of crystallographic defects, including threading dislocations and stacking faults, among others, which are show generically as dislocations 206 in FIG. 2A. In some embodiments, these defects relax the stress in the layer 204 caused by the epitaxial mismatch between the layer 204 and the substrate 200. As described below in more detail, some of the embodiments described herein trap these defects, thus preventing their migration into channel regions of semiconductor devices.

Figure 2B:
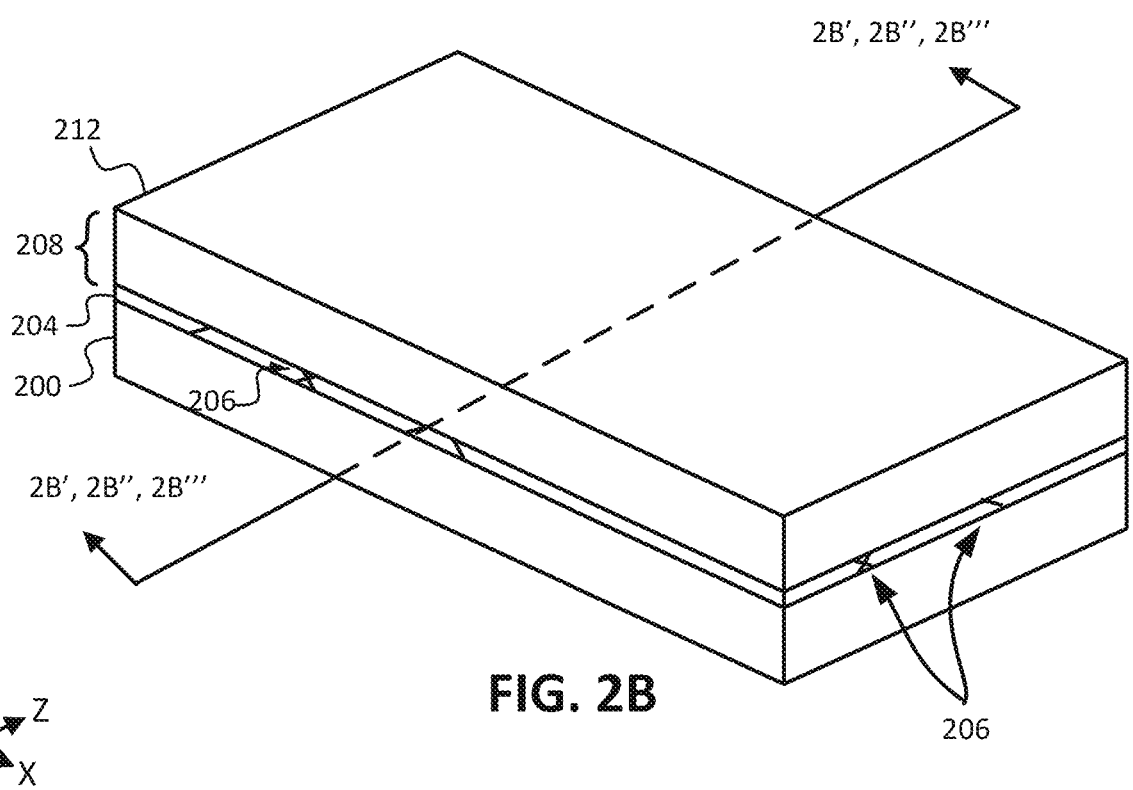

FIG. 2B illustrates, in an embodiment, formation 106 of a defect blocking layer 208 on the rSiGe layer 204. In the embodiment shown in FIG. 2B, the defect blocking layer 208 is an amorphous dielectric layer 212 in which aspect ratio trapping (ART) trenches can be formed (as described below). ART trenches are configured so that defects terminate on a side surface of the ART trench. Side surfaces of the ART trench are sufficiently high relative to the width of the ART trench (i.e., have a high height to width aspect ratio) so as to trap most, if not all, of the defects, thus preventing migration of the defects into, ultimately, channel regions of semiconductor devices. Some examples materials used to form the amorphous dielectric blocking layer 212 may include any suitable electrical insulator, dielectric, oxide (e.g., silicon oxide), and/or nitride (e.g., silicon nitride) material, such as those that can be employed as interlayer dielectric layers (ILD). Other examples of oxide and nitride materials that can be used for the amorphous dielectric layer 212 may include titanium oxide, hafnium oxide, aluminum oxide, and titanium nitride, just to name a few examples. Formation 106 of a defect blocking layer 208 made from an amorphous dielectric layer 212 can include deposition or formation on the rSiGe layer 204 using, for example, chemical vapor deposition (CVD), atomic layer deposition (ALD), physical vapor deposition (PVD), spin-on processing, and/or any other suitable process.

FIGS. 2B' and 2B" show embodiments of the defect blocking layer 208, viewed in cross-section as indicated in FIG. 2B, that are alternatives to the single amorphous dielectric layer 212 of FIG. 2B. While the embodiment shown in FIG. 2B is the primary focus of the following description of the method 100, it will be appreciated that this is for convenience of explanation and that any of the alternative embodiments of the defect blocking layer (e.g., defect blocking layers 208', 208") can be substituted for the defect blocking layer 208 without departing from the scope of the present disclosure.

Figure 1B:
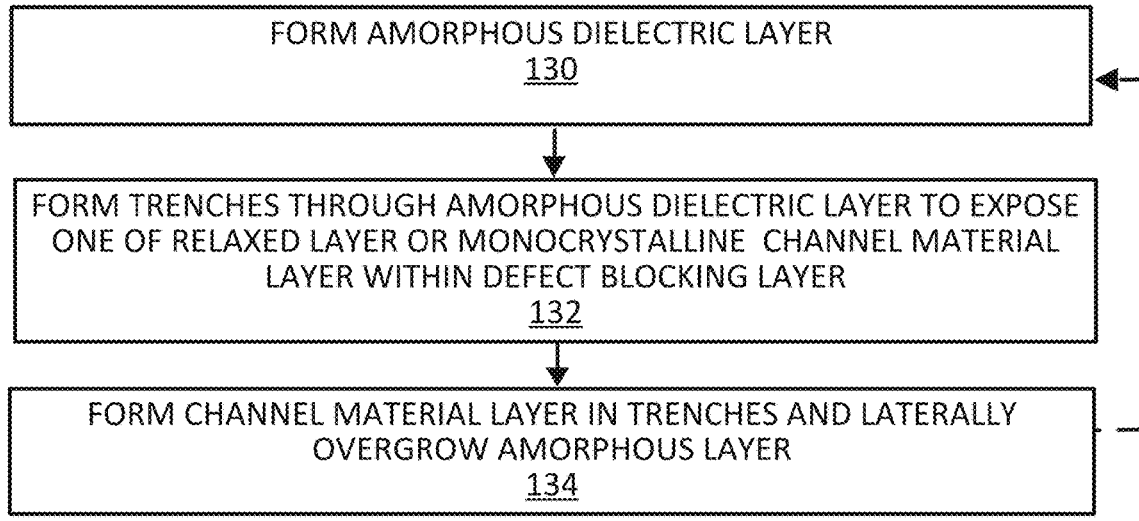

Turning first to FIG. 2B', the defect blocking layer 208' on the rSiGe layer 204 includes, in this example, at least two amorphous dielectric layers 212A, 212B and at least two intervening layers of monocrystalline channel material 216A, 216B. Techniques for forming 106 the defect blocking layer 208' are also shown in FIG. 1B, which illustrates sub-method 106'.

The defect blocking layer 208' is formed by forming 130 an amorphous dielectric layer 212A on the rSiGe layer 204. As described above, amorphous dielectric layers are formed using, for example, CVD, ALD, PVD, spin on processing, among others and can be fabricated from silicon oxide, silicon nitride, among other materials. Once formed, the amorphous dielectric layer 212A can be patterned using any suitable techniques, such as one or more lithography and etch processes, for example to form 132 high aspect ratio ART trenches within the amorphous dielectric layer 212A. The dimensions of the ART trenches, indicated as H (height) and W (width) in an enlarged view in FIG. 2B''', can have a height to width aspect ratio within any of the following ranges: 2.5:1 to 10:1; 3:1 to 7:1; 4:1 to 8:1; and 5:1 to 10:1. In the case of the amorphous dielectric layer 212A, the ART trenches expose corresponding portions of the rSiGe layer 204.

Monocrystalline channel material is then formed 134 within the ART trenches, thus forming posts 220A in the trenches. The monocrystalline channel material can be initially formed 134 within the trenches and then epitaxially and laterally grown into a monocrystalline channel material layer 216A using lateral epitaxial overgrowth (LEO) in this embodiment. In this example, LEO is performed by supplying organometallic precursors to the trenches using OMVPE (organometallic vapor phase epitaxy). These precursors selectively nucleate on crystalline surfaces. Because, as shown, the only crystalline surfaces exposed are those of the rSiGe layer 204 at the bottom the trenches, the channel material nucleates within the ART trenches on the exposed portions of the rSiGe layer 204, grows upward through the ART trenches to form posts 220A, and laterally expands over the surface of the amorphous dielectric layer 212A, thus forming the monocrystalline layer of channel material 216A.

In some examples, the layer of monocrystalline channel material 216A is formed from a SiGe composition that, as will be explained below in more detail, corresponds to a material used as a channel region of one of an n-MOS or a p-MOS transistor. In this way, the strain present at the interface between the rSiGe layer 204 and the material within the high aspect ratio posts 220A can be transferred throughout the defect blocking layer 208' to the channel regions (described below). The function of the high aspect ratio posts 220A, beyond their function in the formation of the layer 216A and the transfer to strain to channel regions, is to trap defects within the rSiGe layer 204 using aspect ratio trapping (ART), as is described below in the context of FIG. 2C'.

As shown in FIG. 1B by the dashed arrow connecting element 134 to element 130 in the method 106', this process can be repeated to form layers 212B, 216B, and posts 220B. Optionally, this process can be repeated any number of times. With each additional sequence of layers 212, 216, and posts 220, a defect density within the channel regions of the final n-MOS and p-MOS devices can be reduced. The method 100 resumes by capping 106 the defect blocking layer 208' with the capping amorphous dielectric layer 222, using techniques and materials described above.

Figure 1C:
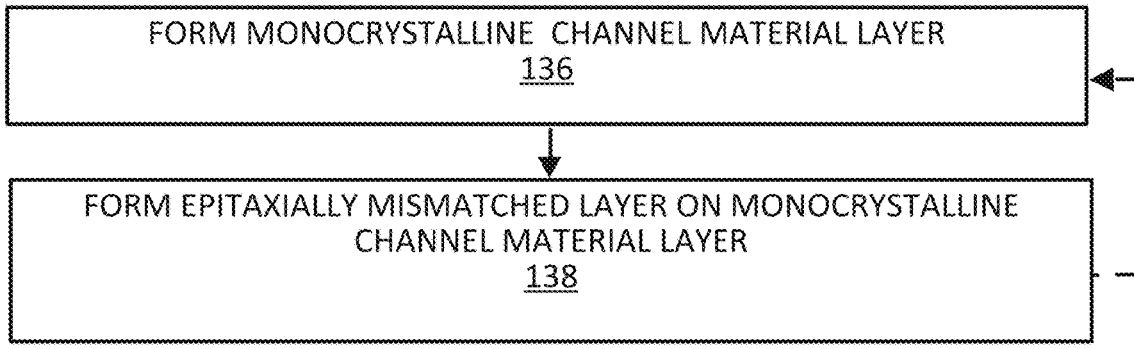

Turning next to FIG. 2B'', an example embodiment defect blocking layer 208'' is comprised of a superlattice structure of alternating layers of monocrystalline channel material (analogous to layers 216A and 216B in FIG. 2B'') and layers of an epitaxially mismatched crystalline material 224 (corresponding to layers 224A, 224B, and 224C in FIG. 2B''). Techniques for forming the defect blocking layer 208'' are also shown in FIG. 1C, which illustrates sub-method 106''.

The defect blocking layer 208'' can trap defects by a different mechanism than that employed by ART defect blocking layer 208' shown in FIG. 2A. Rather than using ART trapping, the superlattice defect blocking layer 208'' traps defects by making it energetically unfavorable for defects to migrate from the rSiGe layer 204 through the superlattice structure defect blocking layer 208''. In one example illustrating this effect, the monocrystalline channel material of the layers 216A and 216B can have a composition of SiGe with a lattice constant of 0.55 nm. Also in this embodiment, the epitaxially mismatched layers 224A, 224B, and 224C are composed of silicon having a lattice constant of 0.543 nm. The epitaxial mismatch between the layers 216 and an adjacent layer 224 is about 1%. In another example, the monocrystalline channel material of the layers 216A and 216B can be a $Si_xGe_{1-x}$ composition and the epitaxially mismatched layers 224A, 224B, and 224C can be silicon alloyed with no more than 2 atomic percent of carbon (which substitutes for silicon atoms in the silicon lattice, thus reducing the lattice constant). In an embodiment the carbon content within silicon can increase from a low value in a layer proximate to the rSiGe layer 204 (e.g., 0.5 atomic % carbon in the layer 224A) to high values at layers closer to the channel regions (e.g., 1 atomic % carbon in the layer 224B and 2 atomic % in the layer 224C). This progressive increase in alloying content, and thus progressive decrease in lattice constant, can increase coherency between layers 216 and 224, reduce the likelihood of defect formation in the layers 216 and 224, while still providing strain to the layer 216C and any subsequently formed channel regions (described below).

Further, the superlattice structure 208'' uses epitaxially mismatched layers 224A, 224B, and 224C having a thickness (i.e., dimension in the "y" direction as indicated in this cross-section) on the order of 1 nm to 8 nm thick, 1 nm to 5 nm thick, or 1 nm to 3 nm thick. A thickness within any one or more of these ranges is less than a critical thickness of 10 nm that would allow the layers 224 to relax the strain caused by the epitaxial mismatch with adjacent layers 216 by producing, for example, dislocations within the layers 224. Limiting the thickness in this way avoids undesired increase in defect density within the defect blocking layer 208''.

Figure 2C:
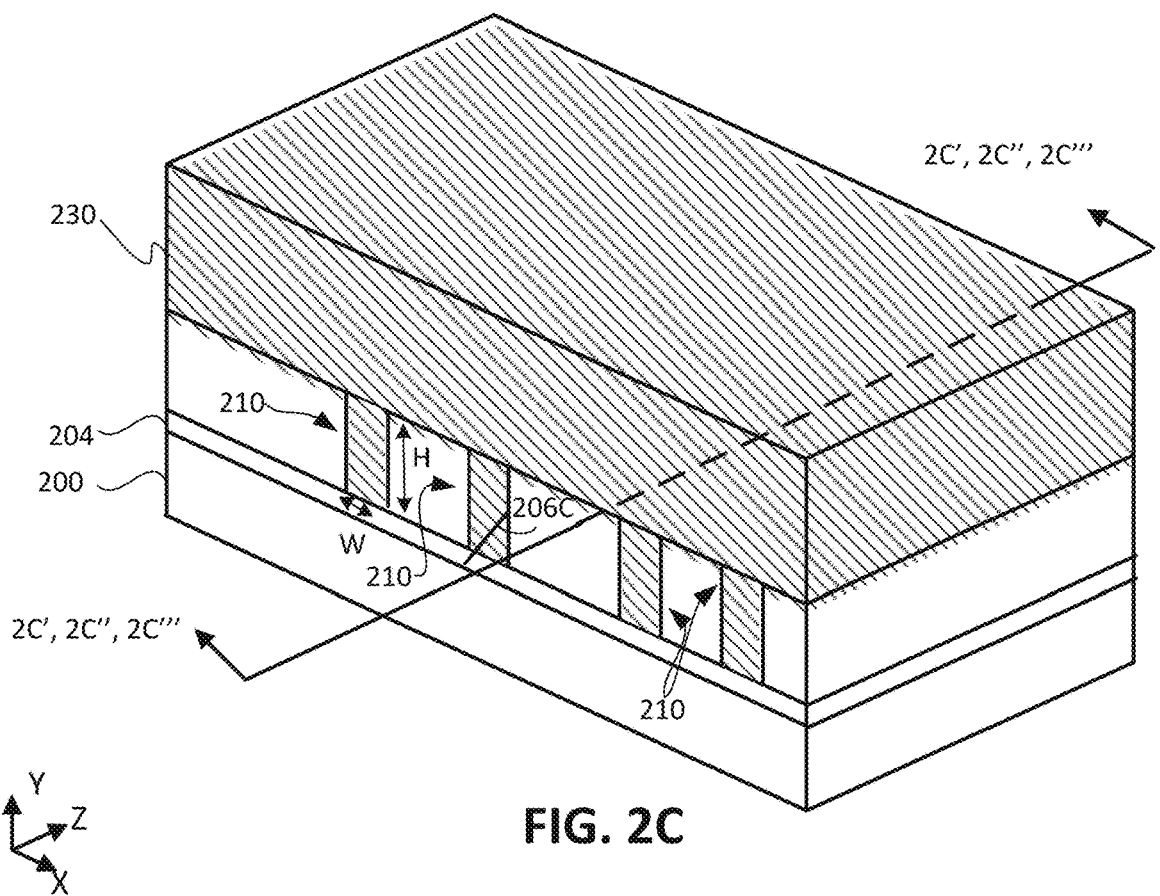

Regardless, because of the sub-10 nm thickness of the layers and the epitaxial mismatch between adjacent layers 216 and 224, the defect blocking layer 208'' provides energetic barriers that impede migration of defects 206 from the rSiGe layer 204 to the channel regions of n-MOS and p-MOS devices (shown in FIG. 2C''). Dislocations that form or migrate to epitaxially mismatched layers 224A, 224B, and 224C, are trapped therein, and can combine with one or more other dislocations to form a loop defect. Because loop defects are significantly less mobile that dislocations, this type of combination further traps defects within the layers 224. Dislocations may also combine to annihilate one another, thus forming un-dislocated single crystal material.

FIG. 1C illustrates the method 106'' for forming the defect blocking layer 208'', an embodiment of which is illustrated in FIG. 2B''. The method 106'' forms the defect blocking layer by first forming 136 a layer of monocrystalline channel material 216A on the rSiGe layer 204 (formed 104 according to the method 100). This layer can be formed using any of the methods described above for formation of this layer. A layer 224A of epitaxial mismatched material (e.g., as described above having an epitaxial mismatch of at least 1%, at least 2%, at least 3%, at least 4%, or more) is then formed on the layer 216A. Techniques using for forming 136 the epitaxial mismatched layer 224A can include PVD, CVD, MOCVD, MBE, among others. The formation of these two layers is then repeated once (e.g., to form layers 216B and 224B), twice (e.g., to form layers 216C and 224C), or more to form the superlattice structure of the defect blocking layer 208''.

The use of the monocrystalline channel material for the layers 216A, 216B, and 216C as one of the alternating layers in the superlattice structure shown in FIG. 2B'' has at least two benefits. First, using the same material in the layers 216A, 216B, 216C and the channel regions makes defect formation less likely (and thus produce fewer defects per unit volume or unit area) than if the material in the layers 216A, 216B, 216C was different than the material in the channel regions. This can be for any number of reasons, including defect formation caused by an interfacial discontinuity between the two materials, and epitaxial mismatch, among others. Second, as long as the interface between the layers 216A, 216B, and 216C and the alternating epitaxially mismatched layers 224A, 224B, and 224C is coherent (i.e., there is a one to one correspondence of lattice planes of the two materials across the interface), strain can be transferred from the interface between the rSiGe layer 204 and the monocrystalline channel material layer 216A through the superlattice structure to the layer 224C. This enables the trapping of defects and also producing strained channel regions, as described herein.

Once the superlattice structure of the defect blocking layer 208'' is formed by the method 106'', the method 100 resumes by capping the defect blocking layer 208'' with the capping amorphous dielectric layer 222, using techniques and materials described above.

The method 100 continues with forming 108 at least one ART trench 210 through one of the amorphous dielectric layer 212 (for the example embodiment shown in FIG. 2B, which relies on ART) and/or optionally forming an ART trench or a non-ART trench through the amorphous capping layer 222 used to cap the defect blocking layer 208', and 208" (as shown in FIGS. 2B' and 2B"). Forming 108 a trench through the amorphous dielectric layer 212 exposes, at the bottom of the trench, the rSiGe layer 204. In the example embodiments illustrated in FIGS. 2B' and 2B", forming 108 a trench 210 through the capping dielectric material layer 222 exposes, at the bottom of the trench 210, a layer of monocrystalline channel material 216. As described above, the exposed rSiGe layer 204 and the layer of monocrystalline channel material 216 can be used as a surface on which to form both strained p-MOS and n-MOS channel regions integrated onto a single substrate.

Regardless of which embodiment of defect blocking layer is used, in some embodiments, the defect blocking layer 208, 208', 208" may have a vertical thickness in the range of 2-100 nm (or in a subrange of 2-25, 2-50, 2-75, 3-25, 3-50, 3-100, 5-25, 5-50, 5-100, 10-25, 10-50, 10-100, 25-50, or 25-100 nm) and/or it may have a maximum vertical thickness of at most 100, 75, 50, 40, 30, 25, 20, 15, 10, or 5 nm, for example. Other suitable thickness values, ranges, and thresholds will be apparent in light of this disclosure. Numerous variations and configurations for the modification layer will be apparent in light of this disclosure.

Figure 2D:
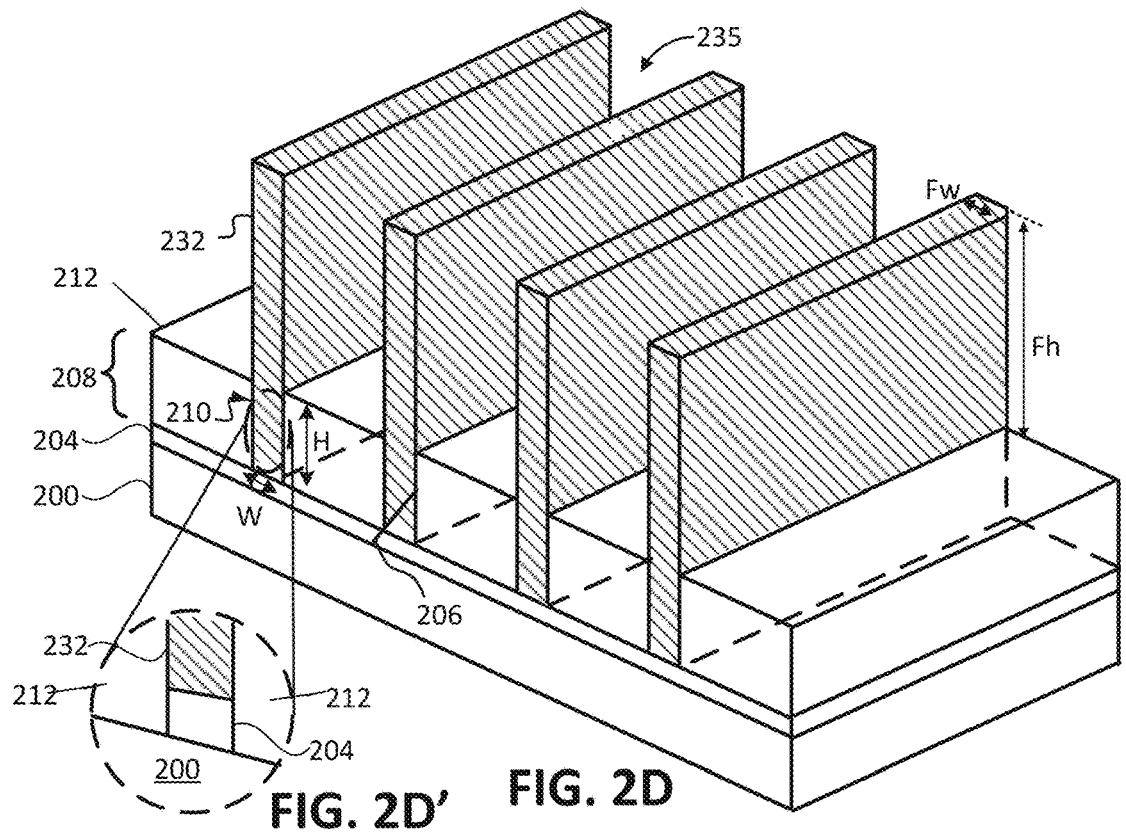

After forming 108 the at least one trench 210, a channel region material layer is formed 110 and patterned 110 into fins that, at least in part, correspond to the formed 108 trenches 210. FIGS. 2C and 2D illustrate forming and patterning 110 fins starting from the embodiment depicted in FIG. 2B. The channel material layer 230 is shown in FIG. 2C as formed on the amorphous dielectric material 212 of defecting blocking layer 208. The channel material is, as is also shown, formed within ART trenches 210 defined by the amorphous dielectric material 212 of defecting blocking layer 208. These trenches 210 are analogous to the ART trenches shown in FIG. 2B''' and described above. Forming the channel material layer 230 so that it fills the ART trenches 210 places the channel material of the layer 230 in contact with the rSiGe layer 204, while at the same time providing a crystallographic constraint that limits the migration of defects from the rSiGe layer 204 into the channel region layer 230.

As indicated above, in some embodiments, the rSiGe layer 204, may serve as a template for the growth of compressively strained p-MOS channel material and tensile-strained n-MOS channel material to achieve gains in hole and electron mobility, respectively, in the channel regions of the devices. The rSiGe layer 204 includes defects (such as dislocations 206 shown in FIG. 2C) that relax the rSiGe layer 204 toward its bulk/unstrained lattice constant value. In such an example embodiment, the rSiGe layer 204 (e.g., with channel regions with 30% atomic Ge content or $Si_{0.7}Ge_{0.3}$) can serve as the template for the growth of compressively strained SiGe channel p-MOS devices (e.g., with 50 atomic % Ge content or $Si_{0.5}Ge_{0.5}$) and tensile-strained Si channel n-MOS devices (e.g., with 25 atomic % Ge content or $Si_{0.25}Ge_{0.75}$), thereby simultaneously achieving large gains in hole mobility for p-MOS devices and electron mobility for the n-MOS devices, which improves the performance of the devices. In another example, employing an rSiGe layer 204 of $Si_{0.7}Ge_{0.3}$ enables the formation of compressively strained $Si_{0.4}Ge_{0.6}$ p-channel material on the $Si_{0.7}Ge_{0.3}$ layer, while also allowing for the formation of tensile-strained Si n-channel material. In contrast, if the $Si_{0.4}Ge_{0.6}$ p-channel material was instead formed on the Si substrate, that $Si_{0.4}Ge_{0.6}$ p-channel material would relax (at least in part) due to the lattice mismatch between Si and $Si_{0.4}Ge_{0.6}$. Such relaxation caused by the lattice mismatch in the example case (where the techniques described herein are not employed) is undesirable, as it leads to a decrease in charge carrier mobility and thereby degrades the overall performance of the device. Further, if the Si n-channel material were instead formed on the Si substrate, the lattice parameters would be exactly matched, and thus, strain would not be produced in the first instance in that Si n-channel material.

In some embodiments, multiple different channel material layers 230 may be formed to be in contact with different areas of the rSiGe layer 204 and/or in contact with different areas of a channel material layer 216 disposed between a defect blocking layer 208', 208" and an amorphous dielectric layer 222. For instance, a first channel material layer 230 may be formed on a first area to be used for one or more p-channel transistor devices (e.g., one or more PMOS devices) and a second channel material 230 may be formed on a second area to be used for one or more n-channel transistor devices (e.g., one or more NMOS devices).

In some embodiments, a given channel material layer 230 may be strained to the underlying rSiGe layer 204 or channel material layer 216 such that the in-plane lattice parameters of the channel material layer 230 are within 50, 45, 40, 35, 30, 25, 20, 15, 10, or 5%, or essentially the same as, the in-plane lattice parameter at/near the top surface of the rSiGe layer 204 or channel material layer 216. Further, where a channel material layer is strained that strain may extend to essentially the top surface of the channel material layer, such that the channel material layer is strained throughout the layer and maintains the strain through subsequent IC processing to the end structure, in accordance with some embodiments.

As also indicated above, the migration of defects (e.g., dislocations 206) from the rSiGe layer 204 into a channel region can detract from the performance improvement produced by straining the channel material. Thus, in the example embodiment shown in FIG. 2C, the ART trenches 210 have a height to width aspect ratio that traps defects within at least one of the rSiGe layer 204 or the portion of the channel material 230 disposed within the high aspect ratio trench 210 of the defect blocking layer 208. This is illustrated in FIG. 2C, in which a dislocation 206 is trapped the rSiGe layer 204 and an ART trench 210.

Method 100 of FIG. 1A continues with patterning 110 the channel region material into fins to form the example resulting structure of FIG. 2D, in accordance with some embodiments. In some embodiments, patterning 110 may be performed using any suitable techniques, such as including one or more masking, patterning, lithography, and/or etching (e.g., wet and/or dry etching) processes, as can be understood based on this disclosure. For instance, the regions of the structure of FIG. 2C to be formed into fins may be masked, followed by etch processing to form trenches 235 between each of the fin-shaped structures of FIG. 2D, for example. Note that the depth of the etch processing used to form the fins may vary and that such etch processing may be referred to as a shallow trench recess (STR) etch. For instance, as shown in FIG. 2D, the etch processing resulted in trenches 235 extending all the way down into defect blocking layer 208, such that each fin includes primarily the material of the channel material layer 230, in this example embodiment.

Note that although each of the fin-shaped structures in FIG. 2D are shown as having the same sizes and shapes relative to one another in this example structure for ease of illustration, the present disclosure is not intended to be so limited. For example, in some embodiments, the fin-shaped structures may be formed to have varying heights Fh and/or varying widths Fw that may correspond with (or be the same as) the final desired fin heights (AFh) and fin widths (Fw) described in more detail below. For instance, in some embodiments, a given Fw (dimension in the X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. Further, in some embodiments, a given Fh (dimension in the Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure.

As previously stated, although the fins in FIG. 2D are shown as having the same heights Fh and widths Fw, the fins may be formed to have varying heights Fh, varying widths Fw, varying vertical starting points (location in the Y-axis direction), varying shapes, and/or any other suitable variation(s) as will be apparent in light of this disclosure. Moreover, trenches 235 may be formed to have varying depths, varying widths, varying vertical starting points (location in the Y-axis direction), varying shapes, and/or any other suitable variation(s) as will be apparent in light of this disclosure. Note that although four fins are shown in the example structure of FIG. 2D for ease of illustration, any number of fins may be formed, such as one, two, three, five, ten, hundreds, thousands, millions, and so forth, as can be understood based on this disclosure. Also note that the fins are shown in FIG. 2D as having a height that is relatively greater than the thickness (dimension in the Y-axis direction) of the remainder of substrate 200, for ease of illustration. However, in some embodiments, the height of the fins (shown as Fh) may be relatively much less (e.g., at least 2-10 times less) than the thickness of the remainder of substrate 200, for example.

FIGS. 2C', and 2C" illustrate alternative example embodiments of patterning 110 channel region material into fins and the alternative mechanisms for preventing migration of defects into the channel material provided by the corresponding embodiments of defect blocking layers 208', and 208", as described above.

Turing first to FIG. 2C', the example embodiment depicted comprises a substrate 200 and an rSiGe layer 204. Dislocations 206A, 206B, and 206C are disposed within the rSiGe layer 204. Defect blocking layer 208', disposed on the rSiGe layer 204, includes layers of monocrystalline channel material layers 216A and 216B (collectively 216), and intervening amorphous dielectric layers 212A and 212B. Posts 220A and 220B, filled with the monocrystalline channel material from layers 216A and 216B are disposed within amorphous dielectric layers 212A and 212B, respectively. A capping amorphous dielectric layer 222 is disposed on the monocrystalline channel material layer 216B.

In the embodiment shown in FIG. 2C', the fins 232 have been patterned 110 so as to contact the monocrystalline channel material layer 216B to facilitate the integration of strained CMOS devices (i.e., a device including both strained n-MOS transistors and strained p-MOS transistors), as described above.

The defect blocking layer 208' includes multiple layers of post layers 220A, 220B, each of which operates using the aspect ratio trapping described above for defect blocking layer 208 in the context of FIG. 2C. For example, as shown in FIG. 2C', the dislocation 206B is disposed in the rSiGe layer 204 and within the one of the posts of the layer 220A. Because of aspect ratio trapping within the post, the dislocation 206B terminates at a sidewall of the post in the layer 220A and is thus unable to migrate further. As described below, this ultimately prevents the dislocation 206B from entering a strained channel region of a p-MOS or n-MOS transistor.

Because the defect blocking layer 208' includes multiple layers 220 that exhibit aspect ratio trapping, the density of defects that can migrate from the rSiGe layer 204 to fins 232 is decreased with each successive layer of ART posts 220 configured to trap defects. This phenomenon is illustrated by dislocation 206C in FIG. 2C'. Dislocation 206C originates within rSiGe layer 204 and passes through one of the posts of the layer 220A, and thence through the monocrystalline channel material layer 216A. However, because the defect trapping layer 208' includes multiple layers of posts 220A and 220B, the dislocation 206C is trapped within one of the posts of a second ART layer 220B due to aspect ratio trapping. Thus, the dislocation 206C is unable to migrate into the fins 232. In some embodiments, each successive ART layer 220 can decrease a defect density at the fins 232 by an order of magnitude, two orders of magnitude, or even three orders of magnitude relative to the defect density of the preceding ART layer 220 (i.e., closer to the rSiGe layer 204). While only two layers of ART layers 220A, 220B are depicted here, it will be appreciated that any number of ART layers 220 can be used to reduce a defect density within fins 232 and ultimately a channel region of a transistor.

As described above in the context of other embodiments, trenches are formed 108 in the capping amorphous dielectric layer 222 so as to expose portions of the monocrystalline channel material layer 216B. Fins 232 are patterned 110 such that the fins 232 are in contact with the exposed portion of the layer 216B, which facilitates the straining of n-MOS and p-MOS channels, as described above.

FIG. 2C" illustrates the superlattice defect blocking layer 208" described above. As shown, the superlattice defect blocking layer 208", disposed between rSiGe layer 204 and amorphous dielectric capping layer 222, includes a plurality of monocrystalline channel material layers 216A, 216B, 216C, and 216D (generically and collectively 216) separated by intervening epitaxially mismatched crystalline material layers 224A, 224B, and 224C (generically and collectively 224). As described above in the context of FIG. 2B", the intervening epitaxially mismatched crystalline material layers 224A, 224B, and 224C can be less than 5 nm and even less than 3 nm thick (in the y-direction in the orientation of the figures). These thicknesses can prevent the formation of defects within the layers 224A-224C because the material is below a critical relaxation thickness where epitaxial mismatched induced stress can be relieved by the formation of defects (e.g., dislocations). Furthermore, the intervening epitaxially mismatched crystalline material layers 224A, 224B, and 224C prevent migration of defects between monocrystalline channel material layers 216A, 216B, 216C, and 216D. This is illustrated, in part, with respect to dislocations 234A, 234B and 234C. As shown, dislocation 234A is disposed within the rSiGe layer 204. The dislocation 234B is disposed within both the rSiGe layer 204 and the monocrystalline channel material layer 216A, but is unable to migrate through the epitaxially mismatched layer 224A. Similarly, the dislocation 234C is trapped within the monocrystalline channel material layer 216B because it is unable to migrate through either of the epitaxially mismatched layers 224A, 224B disposed on opposing sides of the layer 216B. It will be appreciated that any number of layers 216 and corresponding intervening layers 224 can be used in other example embodiments.

As described above in the context of other embodiments, trenches are formed 108 in the capping amorphous dielectric layer 222 so as to expose portions of the monocrystalline channel material layer 216D. Fins 232 are patterned 110 such that the fins 232 are in contact with the exposed portion of the layer 216D, which facilitates the straining of n-MOS and p-MOS channels, as described above.

It will be appreciated that any one of the preceding defect blocking layers 208, 208', and 208" can be combined with one or more of the other defect blocking layers. For example, the defect blocking layers 208 or 208', both of which employ aspect ratio trapping, can be combined with the superlattice structure defect blocking layer 208". Other combinations of different types of defect blocking layers will be appreciated in light of the present disclosure.

Figure 2E:
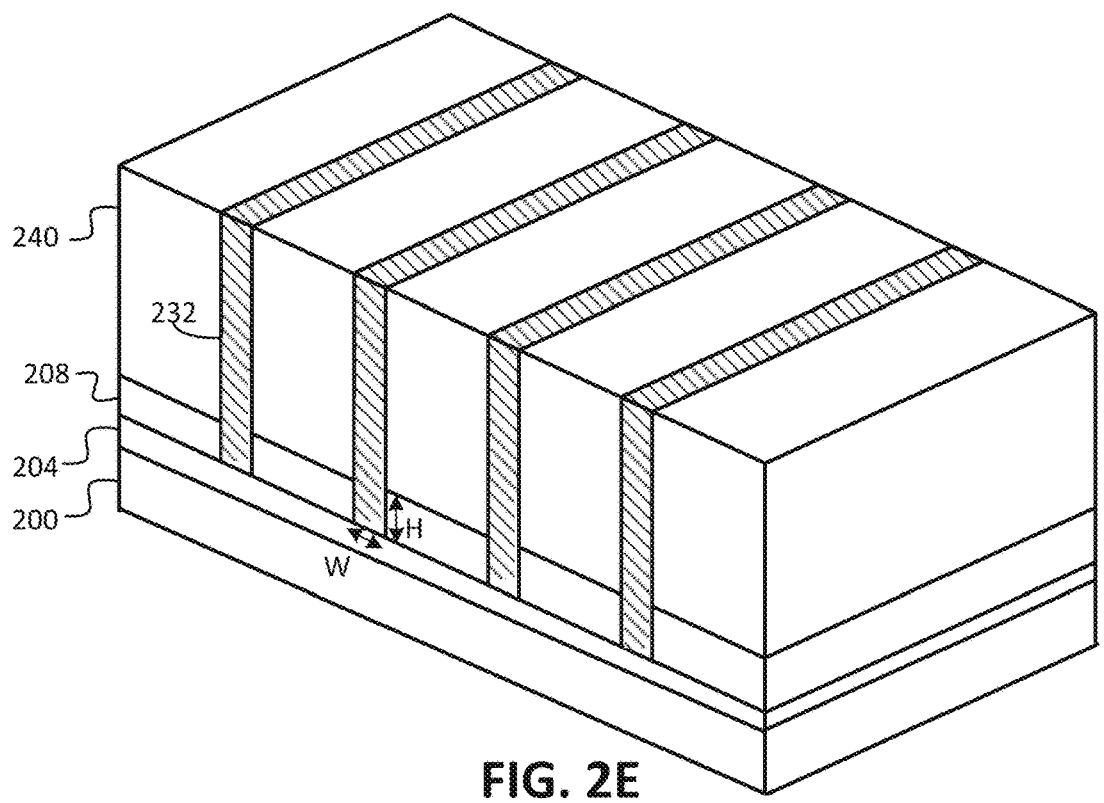

Method 100 of FIG. 1A continues with filling 111 trenches 235 between the fins 232 of the structure of FIG. 2D with shallow trench isolation (STI) material 240, thereby forming the example resulting structure of FIG. 2E, in accordance with some embodiments. It will be appreciated that this step is optionally applicable to embodiments shown in FIGS. 2C', and 2C" and that depiction of the embodiment of FIG. 2C in this context is for convenience of explanation only. Such processing can include depositing the STI material and then optionally planarizing/polishing the structure (e.g., via CMP) to form the example structure of FIG. 2E, for example. In some embodiments, deposition of the STI material 240 may include any suitable deposition techniques, such as those described herein (e.g., CVD, ALD, PVD), or any other suitable deposition process. In some embodiments, STI material 240 (which may be referred to as an STI layer or STI regions) may include any suitable electrical insulator material, such as one or more dielectric, oxide (e.g., silicon dioxide), and/or nitride (e.g., silicon nitride) materials. In some embodiments, the material of STI layer 240 may be selected based on the material of substrate 200, the composition of the rSiGe layer 204, or the composition of the capping layer of amorphous dielectric layer 222. For instance, the STI material may be selected from silicon dioxide or silicon nitride based on the use of a Si substrate 200, to provide some examples.

Figure 2F:
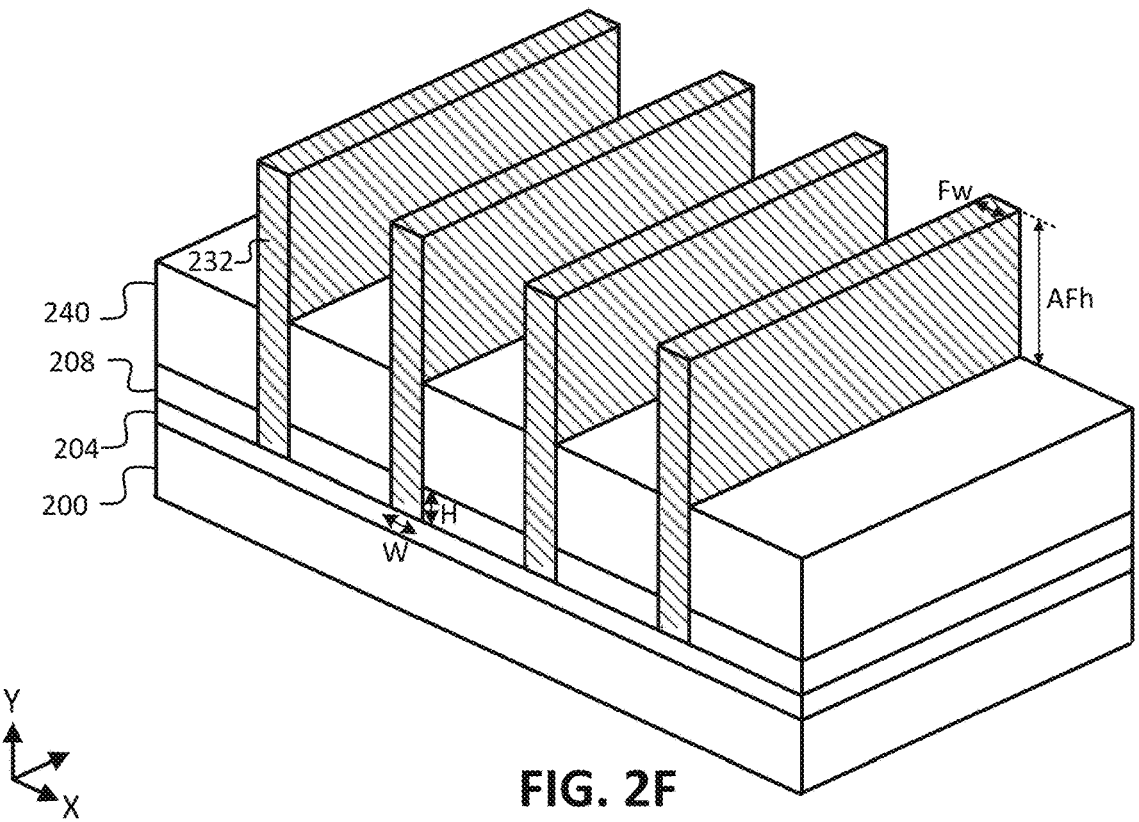

Method 100 of FIG. 1A can continue by optionally recessing 112 the STI material 240 to a desired level to form the example resulting structure of FIG. 2F, in accordance with some embodiments. Note that in some embodiments, recessing 112 is optional and need not be performed, such as for transistors employing planar configurations, for example. For instance, in some such embodiments, transistors may be formed using the top surface of channel material layer 232, as can be understood based on this disclosure. However, in the example embodiment of FIG. 2F, STI material 240 was recessed to allow a portion of the fins 232 to protrude above the top surface of STI material 240 as shown. In some embodiments, recessing 112, when performed, may include any suitable techniques, such as using one or more wet and/or dry etch processes that allow the STI material 240 to be selectively recessed relative to the fin material, and/or any other suitable processing as will be apparent in light of this disclosure.

As can be understood based on this disclosure, that portion of the fin that protrudes above the top plane/surface of the STI material 240 may be used in the active channel region of one or more transistors, such that those fin portions may be referred to as active fin portions herein, for example. Moreover, the remaining portions of the fins extending below the top plane of STI layer 240 to the defect blocking layer 208 (or 208', 208") may be referred to as sub-fin or sub-channel portions, for example, as that structure will be below the channel region of the subsequently formed transistor devices, in at least one IC orientation.

Generally, the active fin height, indicated as AFh, may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights AFh may be at least 25, 50, 75, 100, 125, 150, 175, 200, 300, 400, 500, 600, 700, or 800 nm tall, or greater than any other suitable threshold height as will be apparent in light of this disclosure. The previous relevant description with respect to fin width Fw is equally applicable to the active fin width (which is also indicated as Fw, as it did not change). Numerous different active channel regions may be formed as will be apparent in light of this disclosure.

It will be appreciated that FIG. 2D' illustrates an alternative embodiment in which the layer 204 is disposed between the fin 232 and the substrate 200 within the trench 210. In other words, the layer 204 is not a blanket layer coextensive with the substrate 200 so as to be continuous between fins 232, as is shown in for example FIG. 2C. It will be appreciated that this alternative embodiment is applicable to any of the various embodiments described herein.

Method 100 of FIG. 1A continues with forming 114 the dummy or final gate stack in accordance with some embodiments. As previously described, a gate last fabrication process may utilize a dummy gate stack to allow for replacement gate processing, while a gate first fabrication process may form the final gate stack in the first instance. Continuing from the example structure of FIG. 2F, the processing is primarily described herein in the context of a gate last transistor fabrication flow, where the processing includes forming a dummy gate stack, performing the S/D processing, and then forming the final gate stack after the S/D regions have been processed. In other embodiments, the techniques may be performed using a gate first process flow. In such example embodiments, a dummy gate stack need not be formed, as the final gate stack can be formed in the first instance. However, the description of the continued processing will be described using a gate last process flow, to allow for such a gate last flow (which may include additional processing) to be adequately described. Regardless, the end structure of either a gate first or a gate last process flow will include the final gate stack, as will be apparent in light of this disclosure.

Figure 2G:
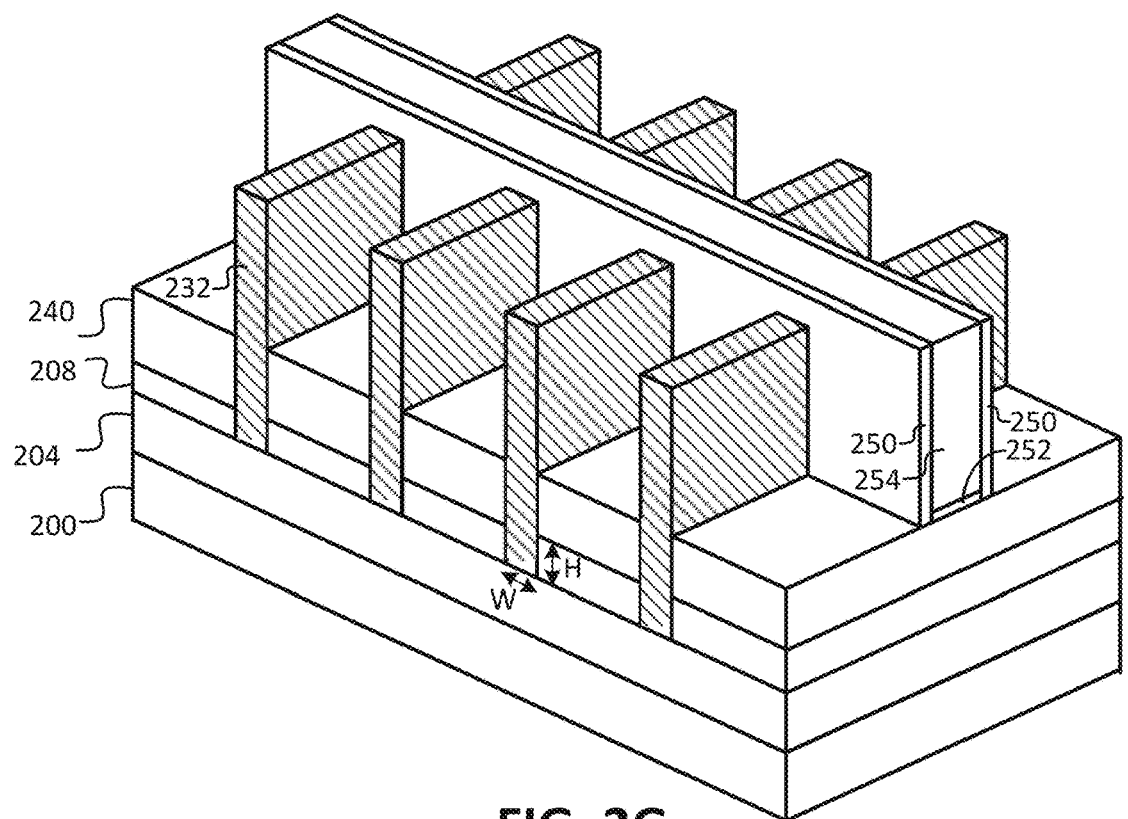

In this example embodiment, the processing includes forming a dummy gate stack (which includes dummy gate dielectric 252 and dummy gate electrode 254) on the structure of FIG. 2F, thereby forming the example resulting structure of FIG. 2G, in accordance with some embodiments. Recall, the formation of the dummy gate stack is optional, because it need not be performed in all embodiments (such as those employing a gate first process flow). In this example embodiment, dummy gate dielectric 252 (e.g., dummy oxide material) and dummy gate electrode 254 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and/or help with replacement gate processing, for example.

As can be understood based on this disclosure, the dummy gate stack (and spacers 250) help define the channel region and source/drain (S/D) regions of each fin, where the channel region is below the dummy gate stack (as it will be located below the final gate stack), and the S/D regions are on either side of and adjacent the channel region. Note that because the IC structures are being described in the context of forming finned transistors, the final gate stack will also be adjacent to either side of the fin, as the gate stack will reside along three walls of the finned channel regions and/or wrap around the active fin portion from one region of STI material 240 to another region of STI material, in some such embodiments. Formation of the dummy gate stack may include depositing the dummy gate dielectric material 252 and dummy gate electrode material 254, patterning the dummy gate stack, depositing gate spacer material 250, and performing a spacer etch to form the structure shown in FIG. 2G, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate stack (which may or may not also be formed over spacers 250) to protect the dummy gate stack during subsequent processing, for example.

Figure 2H:
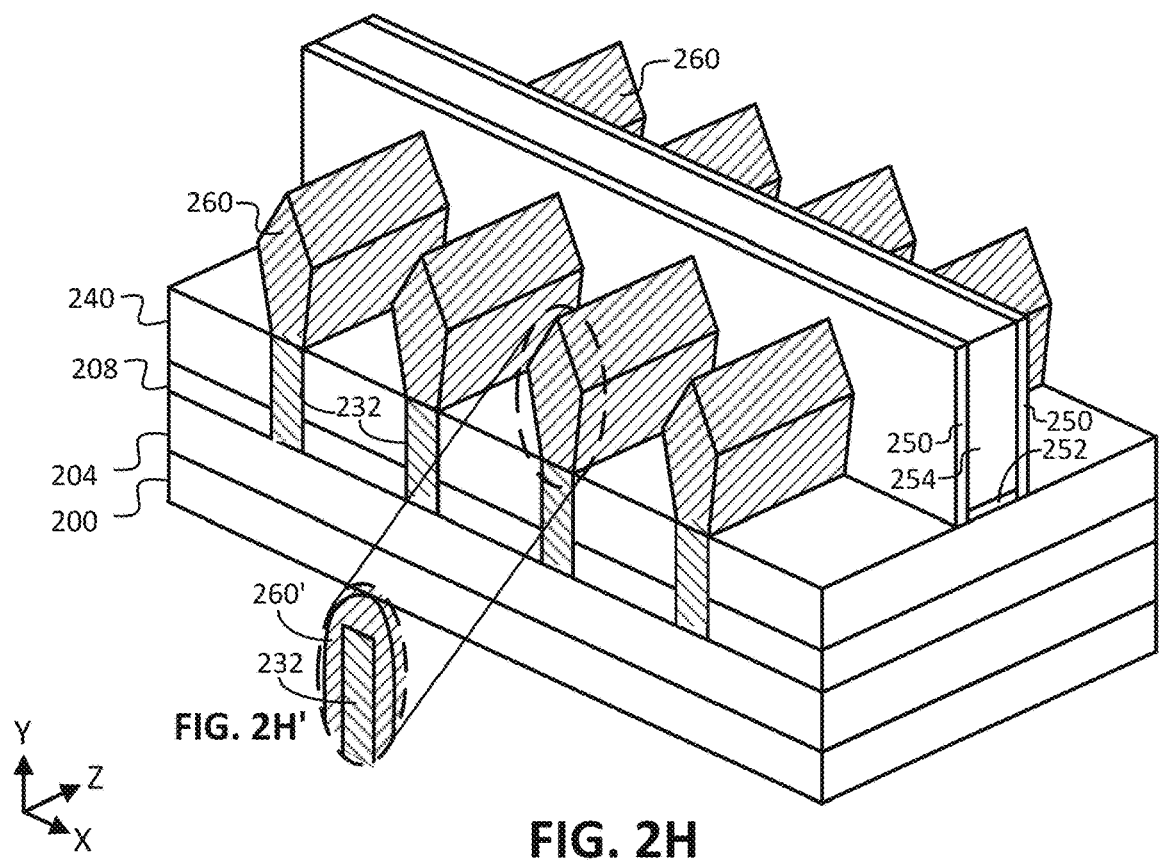
Figure 2I:
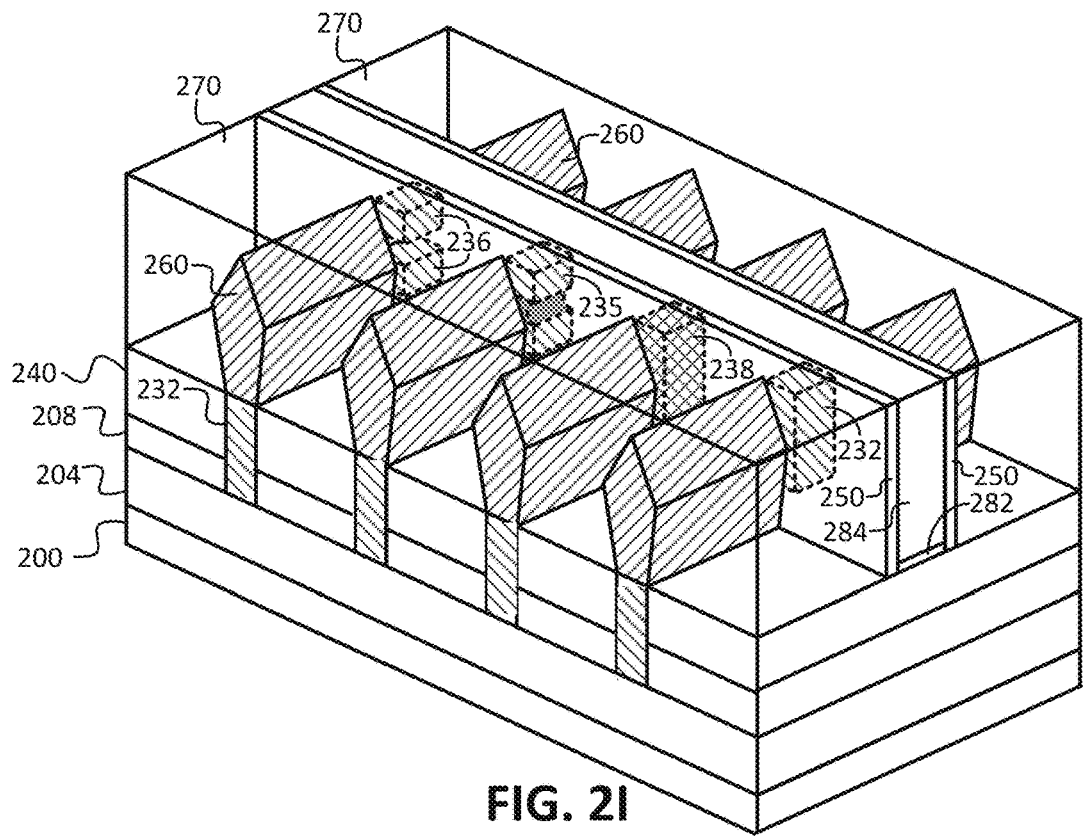

Method 100 of FIG. 1A continues with performing 116 source and drain (S/D) region processing to form the example resulting structure of FIG. 2H, in accordance with some embodiments. The S/D regions 260, in some embodiments, may be formed using any suitable techniques, such as masking regions outside of the S/D regions to be processed, etching at least a portion of the exposed fins from the structure of FIG. 2G, and forming/depositing/growing the S/D regions 260 (e.g., using any suitable techniques, such as CVD, PVD, ALD, VPE, MBE, LPE), for example. However, in some embodiments, the exposed fins (which in the embodiment of FIG. 2G includes channel material layer 232) need not be completely removed, but they may remain (at least in part) in the final S/D regions and be doped, implanted, and/or clad with final S/D material and/or have any other suitable processing performed to convert them into suitable final S/D regions, for example. For instance, FIG. 2H' illustrates an enlarged view of FIG. 2H showing an S/D region formed using a cladding scheme, in accordance with some embodiments. As shown in FIG. 2H', the final S/D material 260' was formed on the original exposed fin in that S/D location (which included channel material layer 232). In the example embodiment of FIG. 2H, as the material of the S/D regions 260 is replacement material, there is a distinct interface between the underlying sub-fin portions (composed of material 232) and S/D regions 260, as shown in FIG. 2H. In some embodiments, one or more of the S/D regions 260 may have a multilayer structure including two or more distinct layers, for example. For instance, in FFFET configurations, the source region has a bi-layer structure that includes two oppositely doped layers (e.g., one is n-type doped and the other is p-type doped), for example. In some embodiments, one or more of the S/D regions 260 may include grading (e.g., increasing and/or decreasing) the content/concentration of one or more materials in some or all of the region(s). For instance, in some embodiments, it may be desired to increase the grading as a given S/D region 260 is formed, to have a relatively lower doping concentration near the channel region and a relatively higher doping concentration near the corresponding S/D contact.

In some embodiments, the S/D regions 260 may be formed one polarity at a time, such as performing processing for one of n-type and p-type S/D regions, and then performing processing for the other of the n-type and p-type S/D regions. In some embodiments, the S/D regions may include any suitable material, such as monocrystalline group IV and/or group III-V semiconductor material and/or any other suitable semiconductor material, as will be apparent in light of this disclosure. In some embodiments, the S/D regions corresponding to a given channel region may include the same group of semiconductor material as what is included in the given channel region, such that if the given channel region includes group IV semiconductor material, the corresponding S/D regions may also include group IV semiconductor material (whether the same IV material or different); however, the present disclosure is not intended to be so limited. In some embodiments, the S/D regions may include any suitable doping scheme, such as including suitable n-type and/or p-type dopant (e.g., in a concentration in the range of 1E16 to 1E22 atoms per cubic cm). However, in some embodiments, at least one S/D region 260 may be undoped/intrinsic or relatively minimally doped, such as including a dopant concentration of less than 1E16 atoms per cubic cm, for example.

To provide some example configurations, in embodiments where corresponding S/D regions on either side of a given channel region are to be used for a MOSFET device, the S/D regions may include the same type of dopants (e.g., where both are p-type doped or both are n-type doped). Specifically, for an n-MOS device, the included S/D regions include semiconductor material that is n-type doped, and for a p-MOS device, the included S/D regions include semiconductor material that is p-type doped, in some embodiments. Whereas for a TFET device, the S/D regions for a given channel region may be oppositely doped, such that one is p-type doped and the other is n-type doped, in some embodiments. Note that for ease of illustration and description, all S/D regions are shown as being the same and are identified collectively by numeral 260. However, in some embodiments, the S/D regions 260 may include differing materials, dopant schemes, shapes, sizes, corresponding channel regions (e.g., 1, 2, 3, or more), and/or any other suitable difference as can be understood based on this disclosure. For instance, the S/D regions 260 of FIG. 2H includes pentagon or diamond-like shape (as viewed in the X-Y plane), while the S/D region 260' of FIG. 2H' includes a rounded or curved hill-like shape (as viewed in the X-Y plane), to provide a few examples. Further note that the shading or patterning of the features/layers of the IC structures included in the various figures is provided merely to assist in visually distinguishing those different IC features/layers. Such shading or patterning is not intended to limit the present disclosure in any manner. Numerous transistor S/D configurations and variations will be apparent in light of this disclosure.

Method 100 of FIG. 1A continues with performing 118 the final gate stack processing to form the example resulting structure of FIG. 2I, in accordance with some embodiments. As shown in FIG. 2I, the processing in this example embodiment included depositing interlayer dielectric (ILD) material 270 on the structure of FIG. 2H, followed by optional planarization and/or polishing (e.g., CMP) to reveal the dummy gate stack. Note that the ILD material 270 is shown as transparent in the example structure of FIG. 2I to allow for the underlying features to be seen (and the ILD material 270 may actually be transparent or translucent at such a small scale); however, the present disclosure is not intended to be so limited. Also note that the ILD layer 270 may include a multilayer structure, even though it is illustrated as a single layer. Further note that in some cases, ILD material 270 and STI material 240 may not include a distinct interface as shown in FIG. 2I, particularly where, e.g., the ILD layer 270 and STI material 240 include the same dielectric material. In some embodiments, the ILD layer 270 may include any suitable material, such as one or more oxides (e.g., silicon oxide), nitrides (e.g., silicon nitride), dielectrics, and/or electrically insulating material, for example.

The gate stack processing, in this example embodiment, continues with removing the dummy gate stack (including dummy gate electrode 254 and dummy gate dielectric 252) to allow for the final gate stack to be formed. Recall that in some embodiments, the formation of the final gate stack, which includes gate dielectric 282 and gate electrode 284, may be performed using a gate first fabrication flow (e.g., an up-front hi-k gate process). In such embodiments, the final gate processing may have been performed prior to the S/D processing, for example. Further, in such embodiments, process 118 need not be performed, as the final gate stack would have been formed at box 114, for example. However, in this example embodiment, the gate stack is formed using a gate last fabrication flow, which may also be considered a replacement gate or replacement metal gate (RMG) process. In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric 282 and gate electrode 284 as shown in FIG. 2I and described herein, in accordance with some embodiments.

Note that when the dummy gate is removed, the channel regions of the previously formed fins 232 (which include channel material layer 230, in this example case) that were covered by the dummy gate are exposed to allow for any desired processing of those channel regions of the fins. Such processing of the channel regions may include various different techniques, such as removing and replacing the channel region with replacement material, doping the channel region of the fin as desired, forming the fin into one or more nanowires (or nanoribbons) for a gate-all-around (GAA) transistor configuration, forming the fin into a beaded-fin configuration, cleaning/polishing the channel region, and/or any other suitable processing as will be apparent in light of this disclosure.

For instance, in FIG. 2I the finned channel regions 232 and 238 are illustrated (which are the channel regions of the right-most finned structure and the second-from-the-right finned structure, respectively), where finned channel region 232 includes the channel material layer previously described and the second finned channel region 238 may include any other suitable configuration. For instance, in some embodiments, second finned channel region 238 may include the material corresponding to fins 232 (i.e., "finned channel region 232"), while in other embodiments, second finned channel region 238 may include a second channel material layer that is compositionally different from the first channel material layer 232, to provide some examples. Thus, and as was previously described, finned channel region 232 may be used for an n-channel or p-channel finned transistor device, while second finned channel region 238 may be used for the other of an n-channel or p-channel finned transistor device, in accordance with an example embodiment. Further, in such an example embodiment, both of the finned channel regions 232 and 238 may be included in a complementary transistor circuit (e.g., a CMOS circuit), for instance.

Other non-planar transistor configurations (that is, other than finned configurations, which may utilize a tri-gate or double-gate scheme) are also shown in the example structure of FIG. 2I. For instance, nanowire channel region 236 may have been formed after the dummy gate stack was removed and the channel regions were exposed, by converting an original finned structure at that location into the nanowires 236 shown using, for example, any suitable techniques. For instance, the original finned channel region may have included a multilayer structure, where one or more of the layers were sacrificial and selective etch processing was performed to remove those sacrificial layers and release the nanowires 236. As shown in FIG. 2I, nanowire channel region 236 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration. To provide yet another example non-planar transistor configuration, beaded-fin channel region 235 is a hybrid between a finned channel region and a nanowire channel region, where the sacrificial material (shown with grey shading) that may have been completely removed to release nanowires was instead only partially removed to form the resulting beaded-fin structure 235 shown. Such a beaded-fin channel region structure may benefit from, for instance, increased gate control (e.g., compared to a finned channel region structure) while also having, for instance, relatively reduced parasitic capacitance (e.g., compared to a nanowire channel region structure). Therefore, numerous different channel region configurations can be employed using the techniques described herein, including planar and a multitude of non-planar configurations.

As can be understood based on this disclosure, the channel region may be at least below the gate stack, in some embodiments. For instance, in the case of a planar transistor configuration, the channel region may just be below the gate stack. However, in the case of a finned transistor configuration, the channel region may be below and between the gate stack, as the gate stack may be formed on three sides of the finned structure (e.g., in a tri-gate manner), as is known in the art. Further, in the case of a nanowire (or nanoribbon or GAA) transistor configuration, the gate stack may substantially (or completely) surround each nanowire/nanoribbon in the channel region (e.g., wrap around at least 80, 85, 90, or 95% of each nanowire/nanoribbon). Regardless, in some embodiments, the gate of a transistor may be proximate to the channel region of that transistor. Generally, in some embodiments, the channel region may include any suitable material, such as monocrystalline group IV and/or group III-V semiconductor material, for example. In some embodiments, the channel region of a given transistor may be doped (e.g., with any suitable n-type and/or p-type dopants) or intrinsic/undoped, depending on the particular configuration. Note that S/D regions 260 are adjacent to either side of a given channel region, as can be seen in FIG. 2I. In other words, each channel region is between corresponding S/D regions 260. Also note that the configuration/ geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor, but the S/D regions need not include such a nanowire (or nanoribbon) shape.

Continuing with the example structure of FIG. 2I, after the dummy gate has been removed and any desired channel region processing has been performed, the final gate stack can be formed, in accordance with some embodiments. In this example embodiment, the final gate stack includes gate dielectric 282 and gate electrode 284, as shown in FIG. 2I. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric 282 and/or gate electrode 284 may include a multilayer structure of two or more material layers, for example. For instance, in some embodiments, a multilayer gate dielectric may be employed to provide a more gradual electric transition from the channel region to the gate electrode, for example. In some embodiments, gate dielectric 282 and/or gate electrode 284 may include grading (e.g., increasing and/or decreasing) the content/concentration of one or more materials in at least a portion of the feature(s). One or more additional layers may also be present in the final gate stack, in some embodiments, such as one or more relatively high or low work function layers and/or other suitable layers, for example. Note that although gate dielectric 282 is only shown below gate electrode 284 in the example embodiment of FIG. 2I, in other embodiments, the gate dielectric 282 may also be present on one or both sides of gate electrode 284, such that the gate dielectric 282 is between gate electrode 284 and one or both spacers 250, for example. Numerous different gate stack configurations will be apparent in light of this disclosure.

Figure 2J:
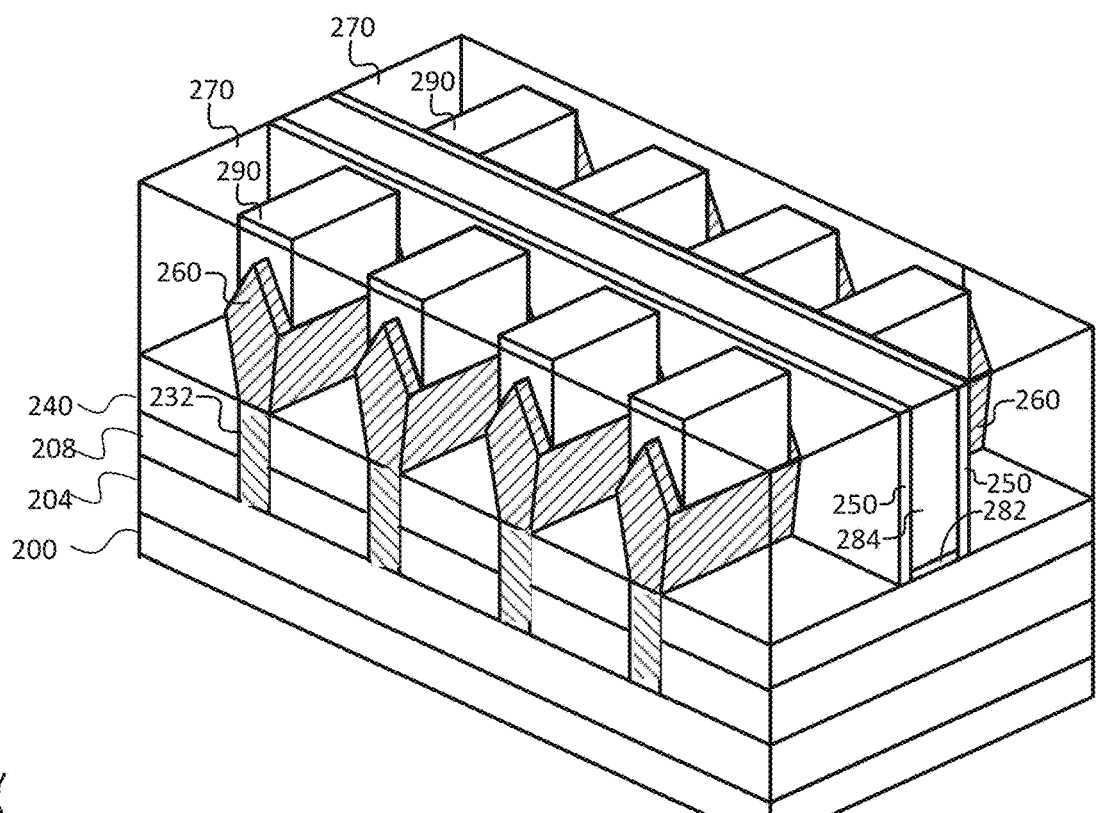

Method 100 of FIG. 1A continues with performing 120 S/D contact processing to form the example resulting structure of FIG. 2J, in accordance with some embodiments. As shown in FIG. 2J, S/D contacts 290 were formed to make contact to each of the S/D regions 260, in this example embodiment. In some embodiments, S/D contacts 290 may be formed using any suitable techniques, such as forming contact trenches in ILD layer 270 over the respective S/D regions 260 and depositing metal or metal alloy (or other suitable electrically conductive material) in the trenches. In some embodiments, S/D contact 290 formation may include silicidation, germanidation, III-V-idation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 260 and its corresponding S/D contact 290, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1A continues with completing 122 general integrating circuit (IC) processing as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-122 in method 100 of FIG. 1A are shown in a particular order for ease of description. However, one or more of the processes may be performed in a different order or may not be performed at all (and thus be optional), in accordance with some embodiments. For example, processes 106, 112, and 118 may be optional in some embodiments, as previously described. Numerous variations on method 100 and the techniques described herein will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; atom probe tomography (APT); or high resolution physical or chemical analysis, to name a few suitable example analytical tools. In particular, in some embodiments, such tools may be used to detect one or more of the defect blocking layers variously described herein, or to detect patterned dielectric layers within a relaxed layer by identifying one or more silicon, germanium, oxygen, nitrogen, carbon, hafnium, strontium, titanium, and/or gadolinium within a defect blocking layer. Furthermore, using one or more of the techniques above (e.g., TEM), decreasing defect densities (e.g., stacking faults, dislocations) can be detected within defect blocking layers relative to a relaxed layer.

Example System

Figure 3:
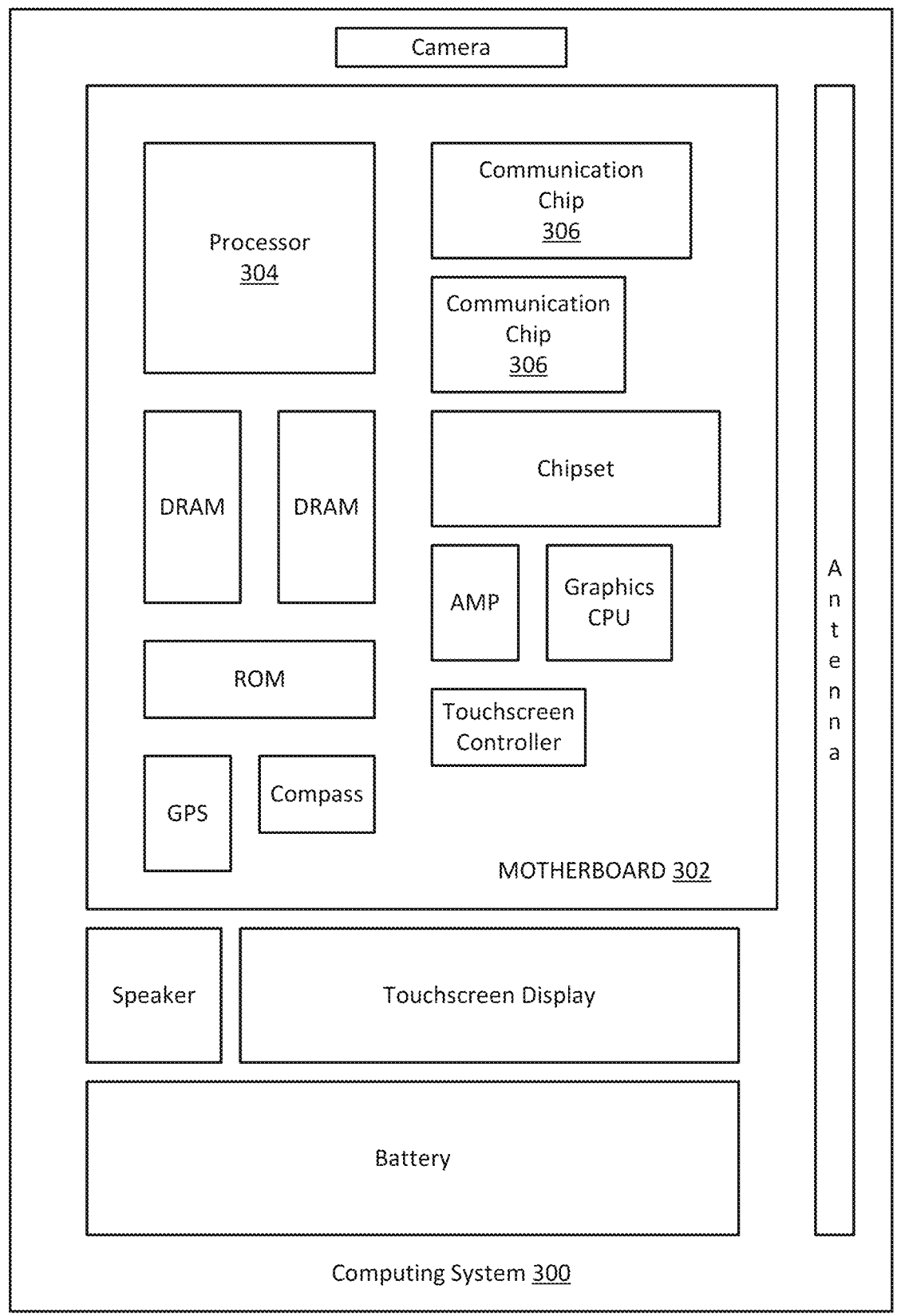
FIG. 3 illustrates a computing system implemented with integrated circuit structures and/or transistor devices formed using the techniques disclosed herein, in accordance with some embodiments of the present disclosure.

FIG. 3 is an example computing system implemented with one or more of the integrated circuit structures as disclosed herein, in accordance with some embodiments of the present disclosure. As can be seen, the computing system 300 houses a motherboard 302. The motherboard 302 may include a number of components, including, but not limited to, a processor 304 and at least one communication chip 306, each of which can be physically and electrically coupled to the motherboard 302, or otherwise integrated therein. As will be appreciated, the motherboard 302 may be, for example, any printed circuit board, whether a main board, a daughterboard mounted on a main board, or the only board of system 300, etc.

Depending on its applications, computing system 300 may include one or more other components that may or may not be physically and electrically coupled to the motherboard 302. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 300 may include one or more integrated circuit structures or devices configured in accordance with an example embodiment (e.g., to include one or more integrated circuits having strained n-MOS transistors and strained p-MOS transistors that include one or more of the defect blocking layers, as variously provided herein). In some embodiments, multiple functions can be integrated into one or more chips (e.g., for instance, note that the communication chip 306 can be part of or otherwise integrated into the processor 304).

The communication chip 306 enables wireless communications for the transfer of data to and from the computing system 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others. In some embodiments, communication chip 306 may include one or more transistor structures having strained n-MOS transistors and strained p-MOS transistors with one or more defect blocking layers as variously described herein.

The processor 304 of the computing system 300 includes an integrated circuit die packaged within the processor 304. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 306 also may include an integrated circuit die packaged within the communication chip 306. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 304 (e.g., where functionality of any chips 306 is integrated into processor 304, rather than having separate communication chips). Further note that processor 304 may be a chip set having such wireless capability. In short, any number of processor 304 and/or communication chips 306 can be used. Likewise, any one chip or chip set can have multiple functions integrated therein.

In various implementations, the computing system 300 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit structure that includes: a substrate comprising a semiconductor substrate material having a first lattice constant; a first layer on the substrate, the first layer comprising a semiconductor material and having a second lattice constant different from the first lattice constant; a second layer comprising an amorphous dielectric material defining a trench; a semiconductor body, the semiconductor body on the first layer and at least partially within the trench, the semiconductor body comprising a semiconductor composition that is distinct from the first layer; a gate structure above the semiconductor body and on opposing sidewalls of the semiconductor body; and a source region and a drain region on the second layer and adjacent to the semiconductor body, the source and drain regions comprising a semiconductor composition that is distinct from the semiconductor body.

Example 2 includes the subject matter of Example 1, wherein the semiconductor substrate material comprises silicon; and the semiconductor material of the first layer comprises silicon and germanium.

Example 3 includes the subject matter of Example 1 or 2, wherein the trench is a first trench and the semiconductor body is a first semiconductor body: the semiconductor material of the first layer comprises from 25 atomic % to 30 atomic % germanium; the second layer further defines a second trench, a second semiconductor body on the first layer and at least partially within the second trench; the first semiconductor body including a strained n-MOS channel region comprising silicon and less than 25 atomic % germanium; and the second semiconductor body including a strained p-MOS channel region comprising silicon and more than 30 atomic % germanium.

Example 4 includes the subject matter of Example 3, wherein at least one of the first trench and the second trench has a height to width aspect ratio of at least 3:1.

Example 5 includes the subject matter of Example 3, wherein at least one of the first trench and the second trench has a height to width aspect ratio of at least 6:1.

Example 6 includes the subject matter of Example 1 or 2, wherein the trench is a first trench and the semiconductor body is a first semiconductor body: the semiconductor material of the first layer comprises from 25 atomic % to 30 atomic % germanium; the second layer further defines a second trench, a second semiconductor body on the first layer and at least partially within the second trench; the first semiconductor body including a strained n-MOS channel region comprising silicon and less than 25 atomic % germanium; and the second semiconductor body including a strained p-MOS channel region comprising silicon and more than 50 atomic % germanium.

Example 7 includes the subject matter of Example 6, wherein at least one of the first trench and the second trench has a height to width aspect ratio of at least 3:1.

Example 8 includes the subject matter of Example 6, wherein at least one of the first trench and the second trench has a height to width aspect ratio of at least 6:1.

Example 9 includes the subject matter of any of the preceding Examples, wherein the second lattice constant is greater than the first lattice constant.

Example 10 includes the subject matter of any of Examples 1-8, wherein the second lattice constant is less than the first lattice constant.

Example 11 includes the subject matter of any of the preceding Examples, wherein a difference between the first lattice constant and the second lattice constant is at least 1%.

Example 12 includes the subject matter of any of the preceding Examples, further comprising a plurality of crystallographic defects in the first layer.

Example 13 includes the subject matter of Example 12, wherein: a first defect density within the first layer is from $10^8$ defects per square centimeter to $10^9$ per square centimeter; and a second defect density within the semiconductor body is less than $10^7$ defects per square centimeter.

Example 14 includes the subject matter of any of the preceding Examples, wherein the amorphous dielectric material comprises at least one of oxygen and nitrogen.

Example 15 includes the subject matter of any of the preceding Examples, wherein the first layer is underneath the trench.

Example 16 includes the subject matter of any of Examples 1-14, wherein the first layer is within the trench.

Example 17 includes the subject matter of any of the preceding Examples, wherein the semiconductor body is a fin.

Example 18 includes the subject matter of any of Examples 1-17, wherein the semiconductor body is a nanowire.

Example 19 is a computing device that includes the subject matter of any of the preceding examples.

Example 20 is an integrated circuit structure that includes: a substrate comprising a semiconductor substrate material having a first lattice constant; a first layer on the substrate, the first layer comprising a semiconductor material and having a second lattice constant different from the first lattice constant; a second layer comprising an amorphous dielectric material, the second layer defining a first trench; a third layer comprising a semiconductor material within the first trench and on the second layer; a fourth layer on the third layer, the fourth layer comprising the amorphous dielectric material and defining a second trench; a fifth layer comprising the semiconductor material within the second trench and on the fourth layer; a sixth layer on the fifth layer, the sixth layer comprising the amorphous dielectric material and defining a third trench; a semiconductor body on the fifth layer and at least partially within the third trench; a gate structure above the semiconductor body and on opposing sidewalls of the semiconductor body; and a source region and a drain region on the sixth layer and adjacent to the semiconductor body, the source and drain regions comprising a semiconductor composition that is distinct from the semiconductor body.

Example 21 includes the subject matter of Example 20, the semiconductor substrate material comprises silicon; and the semiconductor material of the first layer and the semiconductor material of the third layer, the fifth layer, and the semiconductor body comprises silicon and germanium.

Example 22 includes the subject matter of Example 21, wherein the semiconductor body is a first semiconductor body: the semiconductor material of the first layer comprises from 25 atomic % to 30 atomic % germanium; the sixth layer further defines a fourth trench, a second semiconductor body on the fifth layer and at least partially within the fourth trench; the first semiconductor body including a strained n-MOS channel region comprising silicon and less than 25 atomic % germanium; and the second semiconductor body including a strained p-MOS channel region comprising silicon and more than 30 atomic % germanium.

Example 23 includes the subject matter of Example 22, wherein a height to width aspect ratio of any of the trenches is at least 3:1.

Example 24 includes the subject matter of Example 22, wherein a height to width aspect ratio of any of the trenches is at least 6:1.

Example 25 includes the subject matter of Example 21, wherein the semiconductor body is a first semiconductor body: the semiconductor material of the first layer comprises from 25 atomic % to 30 atomic % germanium; the sixth layer further defines a fourth trench, a second semiconductor body on the fifth layer and at least partially within the fourth trench; the first semiconductor body including a strained n-MOS channel region comprising silicon and less than 25 atomic % germanium; and the second semiconductor body including a strained p-MOS channel region comprising silicon and more than 50 atomic % germanium.

Example 26 includes the subject matter Example 25, wherein a height to width aspect ratio of any of the trenches is at least 3:1.

Example 27 includes the subject matter of Example 25, wherein a height to width aspect ratio of any of the trenches is at least 6:1.

Example 28 includes the subject matter of any of Examples 20-27, wherein the second lattice constant is greater than the first lattice constant.

Example 29 includes the subject matter of any of Examples 20-27, wherein the second lattice constant is less than the first lattice constant.

Example 30 includes the subject matter of any of Examples 20-29, wherein a difference between the first lattice constant and the second lattice constant is at least 1%.

Example 31 includes the subject matter of any of Examples 20-30, further comprising a plurality of crystallographic defects in the first layer.

Example 32 includes the subject matter of Example 31, wherein: a first defect density within the first layer is from $10^8$ defects per square centimeter to $10^9$ per square centimeter; and a second defect density within the third layer is less than $10^7$ defects per square centimeter.

Example 33 includes the subject matter of Example 32, wherein a third defect density within the fifth layer is less than $10^6$ defects per square centimeter.

Example 34 includes the subject matter of any of Examples 20-33, wherein the amorphous dielectric material comprises at least one of oxygen and nitrogen.

Example 35 includes the subject matter of any of Examples 20-34, wherein a height to width aspect ratio of any of the trenches is at least 3:1.

Example 36 includes the subject matter of any of Examples 20-35, wherein the first layer is within the first trench.

Example 37 includes the subject matter of any of Examples 20-36, wherein the semiconductor body is a fin.

Example 38 includes the subject matter of any of Examples 20-36, wherein the semiconductor body is a nanowire.

Example 39 is a computing device that includes the subject matter of any of Examples 20 to 38.

Example 40 is an integrated circuit structure comprising a substrate comprising a semiconductor substrate material having a substrate lattice constant; a first layer, the first layer comprising a semiconductor material and on the substrate having a first lattice constant different from the substrate lattice constant; a top layer comprising an amorphous dielectric material and defining a first trench; at least one set of layers between the first layer and the top layer, the at least one set of layers comprising a second layer comprising a semiconductor material having a second lattice constant and a third layer comprising an epitaxially mismatched material having a third lattice constant different from the second lattice constant by at least 1%; a semiconductor body at least partially disposed within the first trench defined by the top layer; a gate structure at least above the semiconductor body and on opposing sidewalls of the semiconductor body; and a source region and a drain region on the top layer adjacent to the semiconductor body, the source and drain regions comprising a semiconductor composition that is distinct from the semiconductor body.

Example 41 includes the subject matter of Example 40, further comprising an additional layer of the semiconductor material having the second lattice constant between the first layer and the at least one set of layers.

Example 42 includes the subject matter of Example 41, wherein the third layer of a first set of the at least one set of layers is on the additional layer of the semiconductor material having the second lattice constant.

Example 43 includes the subject matter of any of Examples 40-42, further comprising at least two sets of layers between the first layer and the top layer, the at least two sets of layers comprising at least two second layers alternating with at least two third layers.

Example 44 includes the subject matter of any of Examples 40-43, wherein the semiconductor material of the second layer comprises silicon and germanium, and the epitaxially mismatched material of the third layer comprises silicon.

Example 45 includes the subject matter of any of Examples 40-44, wherein the semiconductor material of the second layer comprises silicon and germanium and the epitaxially mismatched material of the third layer comprises an alloy of silicon and no more than 2 atomic % of carbon substituted for silicon atoms within the silicon lattice.

Example 46 includes the subject matter of any of Examples 40-45, wherein a crystal lattice of the semiconductor material of the second layer and a crystal lattice of the of the epitaxially mismatched material of the third layer are coherent across an interface therebetween.

Example 47 includes the subject matter of any of Examples 40-46, wherein the semiconductor substrate material comprises silicon; and the semiconductor material of the first layer comprises silicon and germanium.

Example 48 includes the subject matter of Example 47, wherein the semiconductor body is a first semiconductor body: the semiconductor material of the first layer comprises from 25 atomic % to 30 atomic % germanium; the top layer further defines a second trench, a second semiconductor body on the second layer and at least partially within the second trench; the first semiconductor body including a strained n-MOS channel region in the first trench comprising silicon and less than 25 atomic % germanium; and the second semiconductor body including a strained p-MOS channel region in the second trench comprising silicon and more than 30 atomic % germanium.

Example 49 includes the subject matter of Example 48, wherein at least one of the first trench and the second trench has a height to width aspect ratio of at least 3:1.

Example 50 includes the subject matter of Example 48, wherein at least one of the first trench and the second trench has a height to width aspect ratio of at least 6:1.

Example 51 includes the subject matter of Example 47, wherein the semiconductor body is a first semiconductor body: the semiconductor material of the first layer comprises from 25 atomic % to 30 atomic % germanium; the top layer defines a second trench, a second semiconductor body on the second layer and at least partially within the second trench; the first semiconductor body includes a strained n-MOS channel region in the first trench comprising silicon and less than 25 atomic % germanium; and the second semiconductor body including a strained p-MOS channel region in the second trench comprising silicon and more than 50 atomic % germanium.

Example 52 includes the subject matter of Example 51, wherein at least one of the first trench and the second trench has a height to width aspect ratio of at least 3:1.

Example 53 includes the subject matter of Example 51, wherein at least one of the first trench and the second trench has a height to width aspect ratio of at least 6:1.

Example 54 includes the subject matter of any of Examples 40-53, wherein the first lattice constant is greater than the substrate lattice constant.

Example 55 includes the subject matter of any of Examples 40-53, wherein the first lattice constant is less than the substrate lattice constant.

Example 56 includes the subject matter of any of Examples 40-55, wherein a difference between the first lattice constant and the second lattice constant is at least 1%.

Example 57 includes the subject matter of any of Examples 40-56, further comprising a plurality of crystallographic defects in the first layer.

Example 58 includes the subject matter of any of Examples 40-57, further comprising a first defect density within the first layer is from $10^8$ defects per square centimeter to $10^9$ per square centimeter; and a second defect density within the at least one set of layers is less than $10^7$ defects per square centimeter.

Example 59 includes the subject matter of any of Examples 40-58, wherein the amorphous dielectric material of the top layer comprises at least one of oxygen and nitrogen.

Example 60 includes the subject matter of any of Examples 40-59, wherein the semiconductor body is a fin.

Example 61 includes the subject matter of any of Examples 40-59, wherein the semiconductor body is a nanowire.

Example 62 is a computing device that includes the subject matter of any of Examples 40 to 61.

Example 63 is a method for forming an integrated circuit structure that includes: providing substrate comprising a semiconductor substrate material having a first lattice constant; forming a first layer of a semiconductor material on the substrate having a second lattice constant different from the first lattice constant; forming a second layer comprising an amorphous dielectric material; forming a first trench in the second layer; forming a semiconductor body on the first layer and at least partially within the first trench; forming a gate structure above the semiconductor body and on opposing sidewalls of the first semiconductor body; and forming a source region and a drain region on the second layer and adjacent to the semiconductor body, the source and drain regions comprising a semiconductor composition that is distinct from the semiconductor body.

Example 64 includes the subject matter of Example 63, wherein the first layer is formed using a blanket layer, such that the first layer is underneath the first trench.

Example 65 includes the subject matter of Example 63, wherein the first layer is formed within the first trench.

Example 66 includes the subject matter of any of Examples 63-65, wherein the semiconductor body is a fin.

Example 67 includes the subject matter of any of Examples 63-65, wherein the semiconductor body is a nanowire.

Example 68 includes the subject matter of any of Examples 63-67, wherein the semiconductor substrate material comprises silicon; and the semiconductor material of the first layer comprises from 25 atomic % to 30 atomic % germanium.

Example 69 includes the subject matter of Example 68, wherein the semiconductor body is a first semiconductor body and further comprising: forming a second trench in the second layer; and forming a second semiconductor body at least partially within in the second trench, the second semiconductor body including a strained p-MOS channel region in the second trench comprising silicon and more than 30 atomic % germanium, wherein forming the first semiconductor body comprises forming a strained n-MOS channel region comprising silicon and less than 25 atomic % germanium.

Example 70 includes the subject matter of Example 69, wherein at least one of the first trench and the second trench has a height to width aspect ratio of at least 3:1.

Example 71 includes the subject matter of Example 69, wherein at least one of the first trench and the second trench has a height to width aspect ratio of at least 6:1.

Example 72 includes the subject matter of Example 68, wherein the semiconductor body is a first semiconductor body and further comprising: forming a second trench in the second layer; and forming a second semiconductor body at least partially within in the second trench, the second semiconductor body including a strained p-MOS channel region in the second trench comprising silicon and more than 30 atomic % germanium, wherein forming the first semiconductor body comprises forming a strained n-MOS channel region comprising silicon and more than 50 atomic % germanium.

Example 73 includes the subject matter of Example 72, wherein at least one of the first trench and the second trench has a height to width aspect ratio of at least 3:1.

Example 74 includes the subject matter of Example 72, wherein at least one of the first trench and the second trench has a height to width aspect ratio of at least 6:1.

Example 75 includes the subject matter of any of Examples 63-74, wherein a difference between the first lattice constant and the second lattice constant is at least 1%.

Example 76 includes the subject matter of any of Examples 63-75, wherein a first defect density within the first layer is from $10^8$ defects per square centimeter to $10^9$ per square centimeter; and a second defect density within the semiconductor body is less than $10^7$ defects per square centimeter.

Example 77 is a method for forming an integrated circuit structure that includes: providing a substrate comprising a semiconductor substrate material having a first lattice constant; forming a first layer of a first semiconductor material on the substrate having a second lattice constant different from the first lattice constant; forming a second layer, the second layer comprising an amorphous dielectric material; forming a first trench in the second layer; forming a third layer comprising a second semiconductor material within the first trench and on the second layer; forming a fourth layer on the third layer, the fourth layer comprising the amorphous dielectric material; forming a second trench in the fourth layer; forming a fifth layer comprising the second semiconductor material within the second trench and on the fourth layer; forming a sixth layer on the fifth layer, the sixth layer comprising the amorphous dielectric material; forming a third trench in the sixth layer; forming a semiconductor body comprising the second semiconductor material, the semiconductor body at least partially within the third trench; forming a gate structure above the semiconductor body and on opposing sidewalls of the semiconductor body; and forming a source region and a drain region on the sixth layer and adjacent to the semiconductor body, the source and drain regions comprising a semiconductor composition that is distinct from the semiconductor body.

Example 78 includes the subject matter of Example 77, wherein: the semiconductor substrate material comprises silicon; and the first semiconductor material and the second semiconductor material comprises silicon and germanium.

Example 79 includes the subject matter of Example 78, wherein the first semiconductor material and the second semiconductor material comprises from 25 atomic % to 30 atomic % germanium.

Example 80 includes the subject matter of Example 79, wherein the semiconductor body is a first semiconductor body and the method further comprises: forming a fourth trench in the sixth layer; and forming a second semiconductor body in the fourth trench, the second semiconductor body including a strained p-MOS channel region in the fourth trench comprising silicon and more than 30 atomic % germanium, wherein the first semiconductor body includes a strained n-MOS channel region in the third trench comprising silicon and less than 25 atomic % germanium.

Example 81 includes the subject matter of Example 79, wherein the semiconductor body is a first semiconductor body and the method further comprises: forming a fourth trench in the sixth layer; and forming a second semiconductor body in the fourth trench, the second semiconductor body including a strained p-MOS channel region in the fourth trench comprising silicon and more than 50 atomic % germanium, wherein the first semiconductor body includes a strained n-MOS channel region in the third trench comprising silicon and less than 25 atomic % germanium.

Example 82 includes the subject matter of any of Examples 77-81, wherein a difference between the first lattice constant and the second lattice constant is at least 1%.

Example 83 includes the subject matter of any of Examples 77-82, further comprising a plurality of crystallographic defects in the first layer.

Example 84 includes the subject matter of any of Examples 77-83, wherein a first defect density within the first layer is from $10^8$ defects per square centimeter to $10^9$ per square centimeter; and a second defect density within the third layer is less than $10^7$ defects per square centimeter.

Example 85 includes the subject matter of Example 84, wherein a third defect density within the fifth layer is less than $10^6$ defects per square centimeter.

Example 86 includes the subject matter of any of Examples 77-85, wherein a height to width aspect ratio of any of the trenches is at least 3:1.

Example 87 includes the subject matter of any of Examples 77-85, wherein a height to width aspect ratio of any of the trenches is at least 6:1.

Example 88 is a method for forming an integrated circuit structure that includes: providing a substrate comprising a semiconductor substrate material having a first lattice constant; forming a first layer on the substrate having a second lattice constant different from the first lattice constant; forming a top layer comprising an amorphous dielectric material; forming in the top layer a first trench; forming at least one set of layers between the first layer and the top layer, the at least one set of layers comprising a second layer comprising a semiconductor material having a second lattice constant and a third layer on the second layer comprising an epitaxially mismatched material having a third lattice constant different from the second lattice constant by at least 1%; forming a semiconductor body at least partially disposed within the first trench in the top layer; forming a gate structure at least above the semiconductor body; and a source region and a drain region on the top layer adjacent to the semiconductor body, the source and drain regions comprising a semiconductor composition that is distinct from the semiconductor body.

Example 89 includes the subject matter of Example 88, further comprising forming at least two sets of layers between the first layer and the top layer, the at least two sets of layers comprising at least two second layers alternating with at least two third layers.

Example 90 includes the subject matter of either of Examples 88-89, wherein the semiconductor material of the second layer comprises silicon and germanium, and the epitaxially mismatched material of the third layer comprises silicon.

Example 91 includes the subject matter of any of Examples 88-90, wherein the semiconductor material of the second layer comprises silicon and germanium and the epitaxially mismatched material of the third layer comprises an alloy of silicon and no more than 2 atomic % of carbon substituted for silicon atoms within the silicon lattice.

Example 92 includes the subject matter of any of Examples 88-91, wherein a crystal lattice of the semiconductor material of the second layer and a crystal lattice of the of the epitaxially mismatched material of the third layer are coherent across an interface therebetween.

Example 93 includes the subject matter of any of Examples 88-92, wherein: the semiconductor substrate material comprises silicon; and the first layer comprises silicon and germanium.

Example 94 includes the subject matter of Example 93, wherein the first layer comprises from 25 atomic % to 30 atomic % germanium.

Example 95 includes the subject matter of Example 94, wherein the semiconductor body is a first semiconductor body and the method further comprises: forming a second trench in top layer; and forming a second semiconductor body in the second trench including a strained p-MOS channel region comprising silicon and more than 30 atomic % germanium, wherein the first semiconductor body includes a strained n-MOS channel region in the first trench comprising silicon and less than 25 atomic % germanium.

Example 96 includes the subject matter of Example 95, wherein at least one of the first trench and the second trench is an aspect ratio trapping trench having a height to width aspect ratio of at least 3:1.

Example 97 includes the subject matter of Example 95, wherein at least one of the first trench and the second trench is an aspect ratio trapping trench having a height to width aspect ratio of at least 6:1.

Example 98 includes the subject matter of Example 94, wherein the semiconductor body is a first semiconductor body and the method further comprises: forming a second trench in top layer; and forming a second semiconductor body in the second trench including a strained p-MOS channel region comprising silicon and more than 50 atomic % germanium, wherein the first semiconductor body includes a strained n-MOS channel region in the first trench comprising silicon and less than 25 atomic % germanium.

Example 99 includes the subject matter of Example 98, wherein at least one of the first trench and the second trench is an aspect ratio trapping trench having a height to width aspect ratio of at least 3:1.

Example 100 includes the subject matter of Example 98, wherein at least one of the first trench and the second trench is an aspect ratio trapping trench having a height to width aspect ratio of at least 6:1.

Example 101 includes the subject matter of any of Examples 88-100, wherein a difference between the first lattice constant and the second lattice constant is at least 1%.

Example 102 includes the subject matter of any of Examples 88-101, further comprising a plurality of crystallographic defects in the first layer.

Example 103 includes the subject matter of Example 102 further comprising a first defect density within the first layer is from $10^8$ defects per square centimeter to $10^9$ per square centimeter; and a second defect density within the at least one set of layers is less than $10^7$ defects per square centimeter.

What is claimed is:

1. An integrated circuit structure comprising:
    a substrate comprising a semiconductor substrate material having a first lattice constant;
    a first layer on the substrate, the first layer comprising a semiconductor material and having a second lattice constant different from the first lattice constant;
    a second layer comprising an amorphous dielectric material defining a trench;
    a body, the body on the first layer and at least partially within the trench, the body comprising a semiconductor composition that is distinct from the first layer;
    a gate structure above the body and on opposing sidewalls of the body; and a source region and a drain region adjacent to the gate structure, the source and drain regions each comprising a cladding layer on a top and sides of the body, the cladding layer having a semiconductor composition that is distinct from the body, and the cladding layer having a non-uniform thickness on the top of the body, wherein the cladding layer on the source region is discontinuous from the cladding layer on the drain region.

2. The integrated circuit structure of claim 1, wherein:
the semiconductor substrate material comprises silicon; and
the semiconductor material of the first layer comprises silicon and germanium.

3. The integrated circuit structure of claim 2, wherein the trench is a first trench and the body is a first body:
the semiconductor material of the first layer comprises from 25 atomic % to 30 atomic % germanium;
the second layer further defines a second trench, a second body on the first layer and at least partially within the second trench;
the first body including a strained n-MOS channel region comprising silicon and less than 25 atomic % germanium; and
the second body including a strained p-MOS channel region comprising silicon and more than 30 atomic % germanium.

4. The integrated circuit structure of claim 3, wherein at least one of the first trench and the second trench has a height to width aspect ratio of at least 3:1.

5. The integrated circuit of claim 3, wherein at least one of the first trench and the second trench has a height to width aspect ratio of at least 6:1.

6. The integrated circuit structure of claim 2, wherein the trench is a first trench and the body is a first body:
the semiconductor material of the first layer comprises from 25 atomic % to 30 atomic % germanium;
the second layer further defines a second trench, a second body on the first layer and at least partially within the second trench;
the first body including a strained n-MOS channel region comprising silicon and less than 25 atomic % germanium; and
the second body including a strained p-MOS channel region comprising silicon and more than 50 atomic % germanium.

7. The integrated circuit structure of claim 6, wherein at least one of the first trench and the second trench has a height to width aspect ratio of at least 3:1.

8. The integrated circuit structure of claim 6, wherein at least one of the first trench and the second trench has a height to width aspect ratio of at least 6:1.

9. The integrated circuit structure of claim 1, wherein the second lattice constant is greater than the first lattice constant.

10. The integrated circuit structure of claim 1, wherein the second lattice constant is less than the first lattice constant.

11. The integrated circuit structure of claim 1, wherein a difference between the first lattice constant and the second lattice constant is at least 1%.

12. The integrated circuit structure of claim 11, further comprising a plurality of crystallographic defects in the first layer.

13. The integrated circuit structure of claim 10, wherein:
a first defect density within the first layer is from $10^8$ defects per square centimeter to $10^9$ per square centimeter; and
a second defect density within the body is less than $10^7$ defects per square centimeter.

14. The integrated circuit structure of claim 1, wherein the amorphous dielectric material comprises at least one of oxygen and nitrogen.

15. The integrated circuit structure of claim 1, wherein the first layer is underneath the trench or within the trench.

16. The integrated circuit structure of claim 1, wherein the body is a fin.

17. The integrated circuit structure of claim 1, wherein the body is a nanowire.

18. A computing device comprising the integrated circuit structure of claim 1.

19. An integrated circuit (IC) structure comprising:
a substrate comprising a semiconductor substrate material having a first lattice constant;
a first layer on the substrate, the first layer comprising a semiconductor material and having a second lattice constant different from the first lattice constant;
a second layer comprising an amorphous dielectric material, the second layer defining a first trench;
a third layer comprising a semiconductor material within the first trench and on the second layer;
a fourth layer on the third layer, the fourth layer comprising the amorphous dielectric material and defining a second trench; a fifth layer comprising the semiconductor material within the second trench and on the fourth layer;
a sixth layer on the fifth layer, the sixth layer comprising the amorphous dielectric material and defining a third trench;
a body on the fifth layer and at least partially within the third trench, the body comprising semiconductor material;
a gate structure above the body and on opposing sidewalls of the body; and
a source region and a drain region on the sixth layer and adjacent to the body, the source and drain regions comprising a semiconductor composition that is distinct from the body.

20. The integrated circuit structure of claim 19, wherein the semiconductor substrate material comprises silicon, and the semiconductor material of the first layer comprises silicon and germanium.

21. An integrated circuit structure comprising:
a substrate comprising a semiconductor substrate material having a first lattice constant;
a first layer on the substrate, the first layer comprising a semiconductor material and having a second lattice constant different from the first lattice constant;
a second layer comprising an amorphous dielectric material defining a trench;
a body, the body on the first layer and at least partially within the trench, the body comprising a semiconductor composition that is distinct from the first layer;
a gate structure above the body and on opposing sidewalls of the body; and
a source region and a drain region on the second layer and adjacent to the body, the source and drain regions comprising a semiconductor composition that is distinct from the body, wherein the trench is a first trench and the body is a first body:
the semiconductor material of the first layer comprises from 25 atomic % to 30 atomic % germanium;
the second layer further defines a second trench, a second body on the first layer and at least partially within the second trench;

the first body including a strained n-MOS channel region comprising silicon and less than 25 atomic % germanium; and the second body including a strained p-MOS channel region comprising silicon and more than 30 atomic % germanium.

* * * * *